(12) United States Patent
Naruse et al.

(10) Patent No.: US 7,719,591 B2
(45) Date of Patent: May 18, 2010

(54) SOLID-STATE IMAGING DEVICE

(75) Inventors: Junji Naruse, Kawasaki (JP); Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 403 days.

(21) Appl. No.: 11/736,315

(22) Filed: Apr. 17, 2007

(65) Prior Publication Data
US 2007/0247537 A1  Oct. 25, 2007

(30) Foreign Application Priority Data
Apr. 20, 2006 (JP) ............... 2006-117046

(51) Int. Cl.
*H04N 5/335* (2006.01)
(52) U.S. Cl. ............ 348/308; 348/274; 348/276; 257/445
(58) Field of Classification Search ........ 348/241, 348/243, 273, 274, 275, 276, 277, 279, 302, 348/308, 309, 342; 257/230, 297, 345, 445
See application file for complete search history.

(56) References Cited

U.S. PATENT DOCUMENTS

| | | | | |
|---|---|---|---|---|
| 4,242,694 A * | 12/1980 | Koike et al. | ........... | 257/294 |
| 5,592,223 A * | 1/1997 | Takamura et al. | ........... | 348/309 |
| 5,656,835 A * | 8/1997 | Komobuchi | ........... | 257/232 |
| 6,008,843 A * | 12/1999 | Yu | ........... | 348/274 |
| 6,303,919 B1 | 10/2001 | Yokomichi et al. | | |
| 6,884,651 B2 * | 4/2005 | Toyoda et al. | ........... | 438/72 |
| 7,154,546 B1 * | 12/2006 | Cho | ........... | 348/272 |
| 7,262,404 B2 * | 8/2007 | Yamaguchi et al. | ........... | 250/226 |
| 7,345,703 B2 * | 3/2008 | Lee | ........... | 348/272 |
| 7,541,571 B2 * | 6/2009 | Lee | ........... | 250/214.1 |
| 2001/0045580 A1 * | 11/2001 | Descure | ........... | 257/225 |
| 2003/0228736 A1 * | 12/2003 | Kimura | ........... | 438/286 |
| 2006/0279649 A1 * | 12/2006 | Cole | ........... | 348/308 |
| 2007/0091190 A1 * | 4/2007 | Iwabuchi et al. | ........... | 348/294 |

FOREIGN PATENT DOCUMENTS

JP  2005-129965  5/2005

OTHER PUBLICATIONS

S. M. Sze, "Physics of Semiconductor Devices, Second Edition", John Wiley & Sons, 2 pages (cover sheet, pp. 750-751).

* cited by examiner

*Primary Examiner*—Lin Ye
*Assistant Examiner*—Chriss S Yoder, III
(74) *Attorney, Agent, or Firm*—Oblon, Spivak, McClelland, Maier & Neustadt, L.L.P.

(57) ABSTRACT

A solid-state imaging device that suppresses crosstalk of light in a semiconductor substrate that caused by diffraction of light is disclosed. According to one aspect of the present invention, there is provided a solid-state imaging device comprising a plurality of pixels, each pixel comprising a photoelectric conversion element that is provided in a semiconductor substrate and performs photoelectric conversion of incident light to store signal charges, a floating junction that is provided in the semiconductor substrate in the proximity of the photoelectric conversion element and temporarily stores signal charges, and a transfer transistor that transfers the signal charges stored in the photoelectric conversion element to the floating junction, wherein at least one transfer transistor includes a gate electrode extended to cover a corresponding photoelectric conversion element.

16 Claims, 20 Drawing Sheets

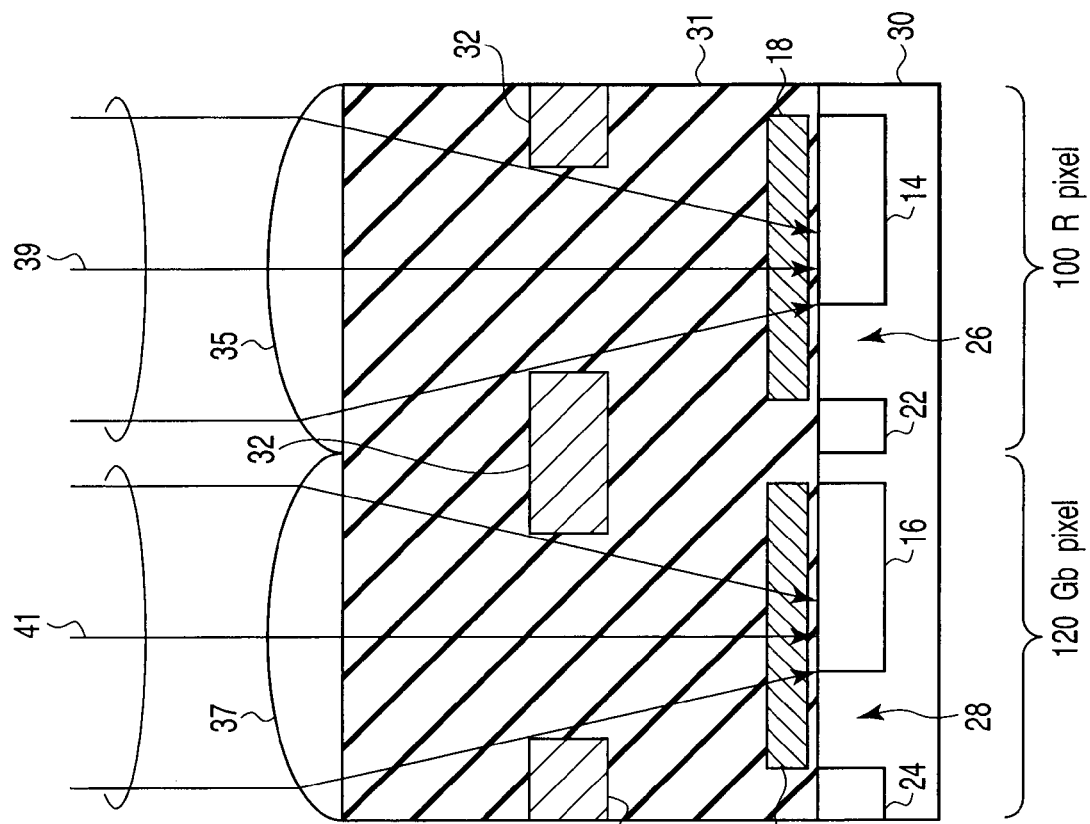
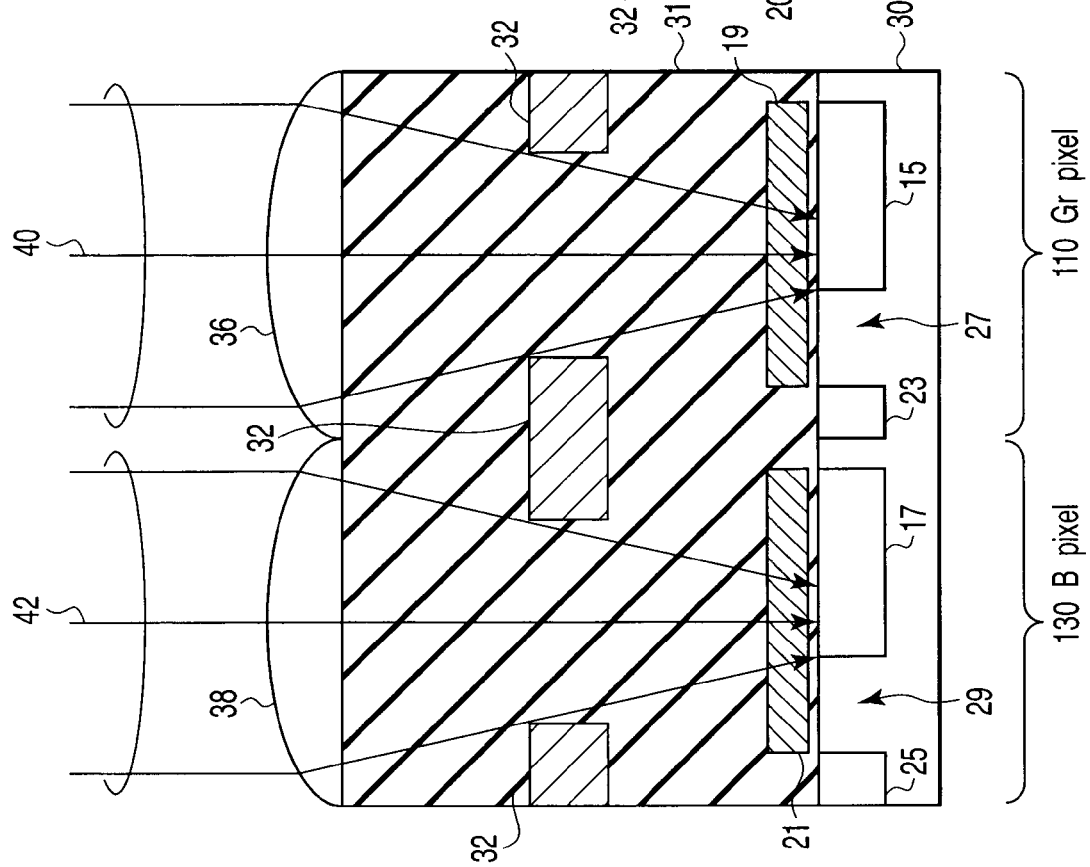
FIG. 4A
FIG. 4B

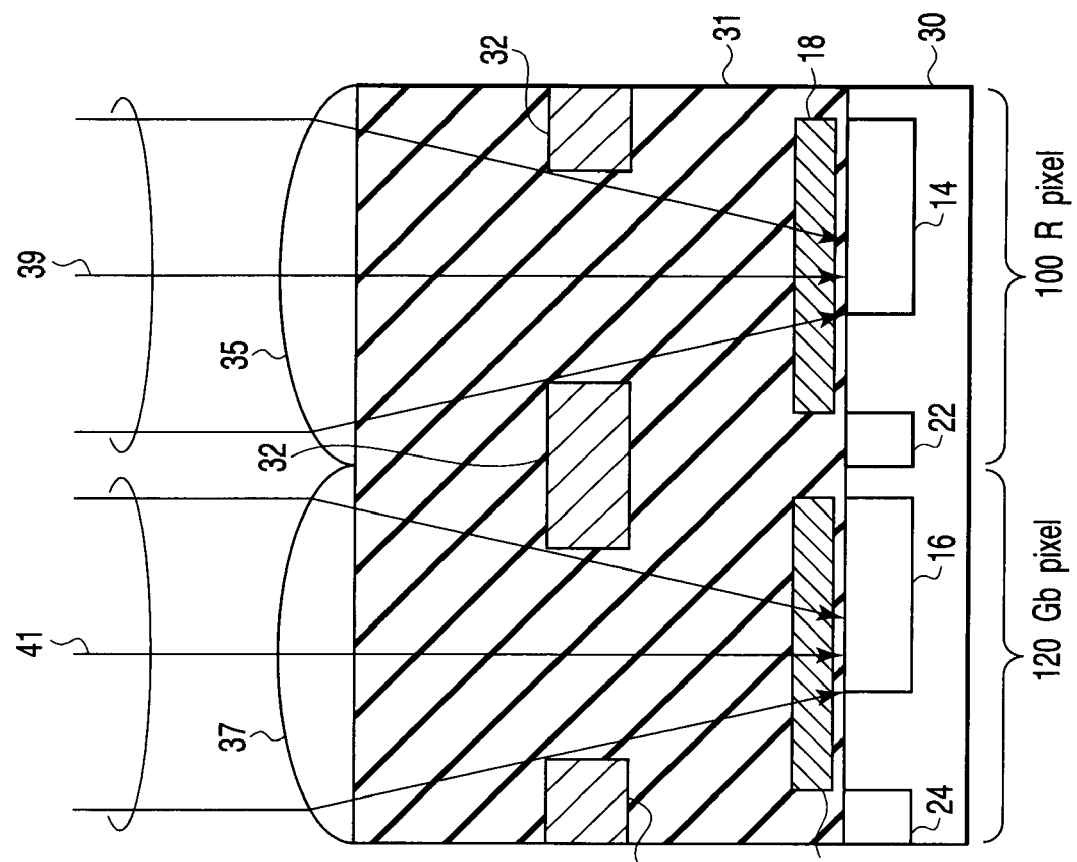
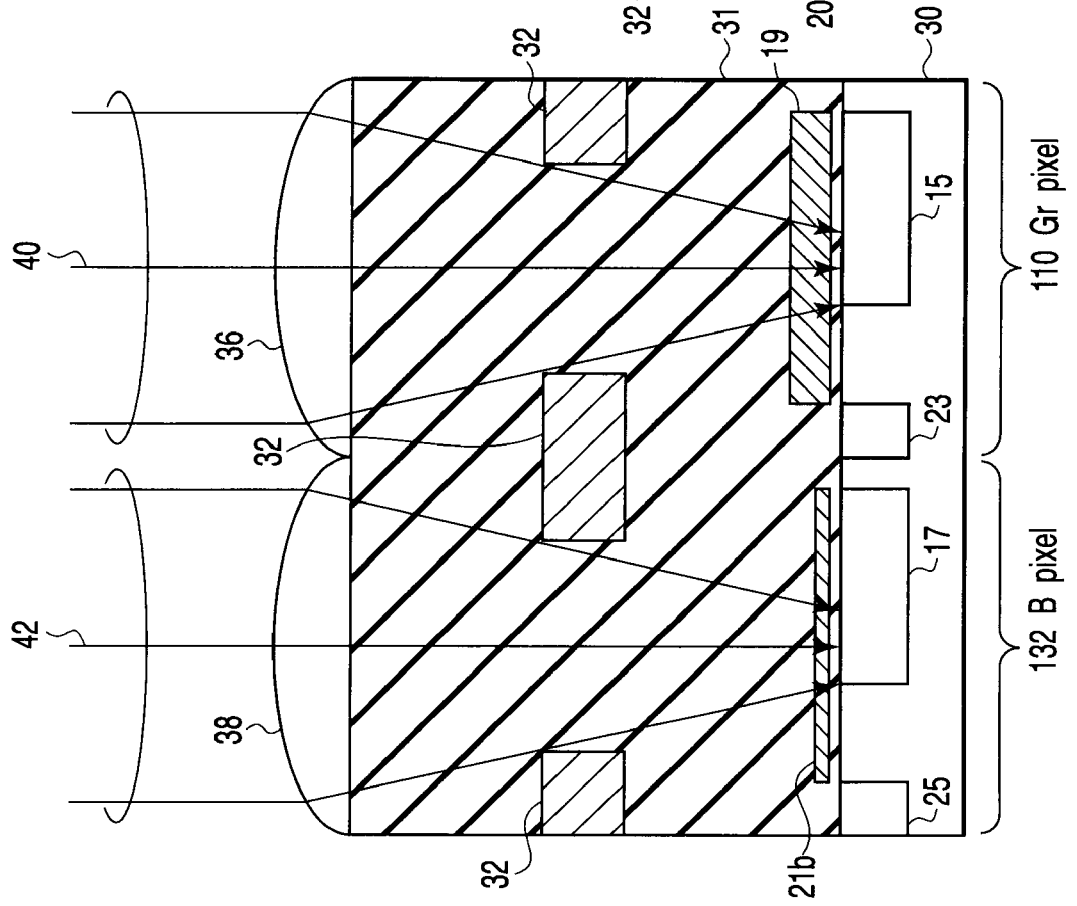
FIG. 6B
FIG. 6A

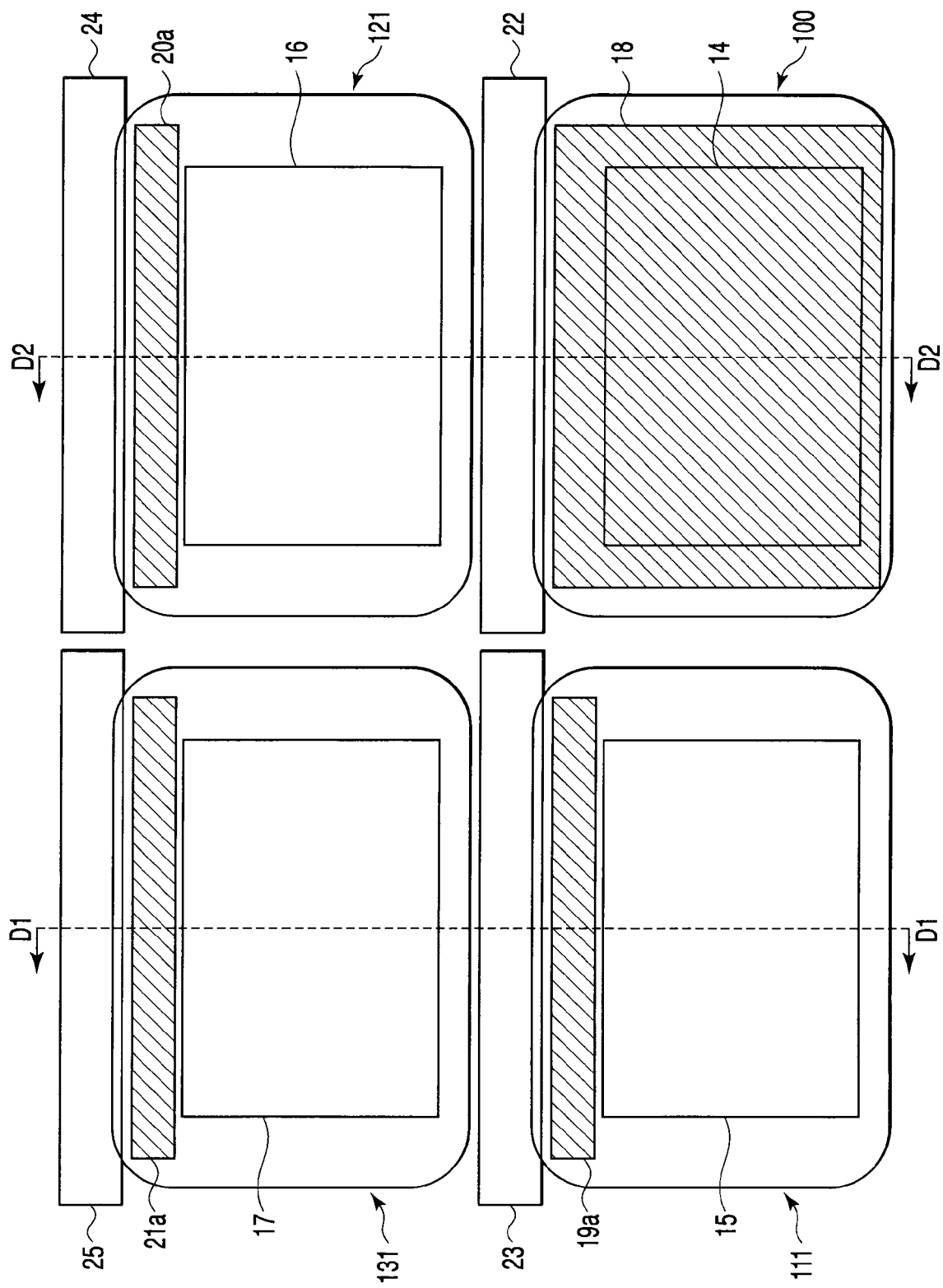
F I G. 9

SOLID-STATE IMAGING DEVICE

CROSS-REFERENCE TO RELATED APPLICATIONS

This application is based upon and claims the benefit of priority from prior Japanese Patent Application No. 2006-117046, filed Apr. 20, 2006, the entire contents of which are incorporated herein by reference.

BACKGROUND OF THE INVENTION

1. Field of the Invention

The present invention relates to a solid-state imaging device, and more particularly to a solid-state imaging device that suppresses crosstalk of light.

2. Description of the Related Art

In a solid-state imaging device, e.g., a device such as a CMOS image sensor, a pixel size is reduced for the purpose of realizing a miniaturization, a higher accuracy, and others. Therefore, a reduction in size of a photoelectric conversion element and/or a transistor constituting a pixel has been advanced. Since a quantity of signal charges that can be stored in the photoelectric conversion element is decreased when a reduction in size advances, each pixel tends to become sensitive to various kinds of noises, such as thermal noise, dark current noise, and crosstalk of light.

Jpn. Pat. Appln. KOKAI Publication No. 2005-129965 discloses a solid-state imaging device that suppresses occurrence of thermal noise or dark current noise to improve a signal-to-noise (S/N) ratio of an image. However, this publication does not describe about crosstalk.

A reduction in size of a photoelectric conversion element makes it difficult to allowing incident light to be condensed by a microlens to enter the photoelectric conversion element alone. According to the solid-state imaging device disclosed in the above patent document, a gate electrode of a transfer transistor is disposed to be adjacent to a photoelectric conversion element. In a solid-state imaging device having such a configuration, for example, incident light is condensed by the microlens to enter the photoelectric conversion element through a space between metal wiring lines. However, a phenomenon that the incident light irradiates not only the photoelectric conversion element but also a gate electrode of a transfer transistor disposed adjacent thereto occurs. When this phenomenon occurs, a part of the incident light causes a diffraction phenomenon at an edge of the gate electrode. Diffracted light diffracted by the gate electrode is propagated through a semiconductor substrate to reach a neighboring floating junction and/or a photoelectric conversion element. Such diffracted light produces crosstalk of light, thereby deteriorating pixel characteristics.

BRIEF SUMMARY OF THE INVENTION

According to one aspect of the present invention, there is provided a solid-state imaging device comprising: a plurality of pixels, each pixel comprising: a photoelectric conversion element that is provided in a semiconductor substrate and performs photoelectric conversion of incident light to store signal charges; a floating junction that is provided in the semiconductor substrate in the proximity of the photoelectric conversion element and temporarily stores signal charges; and a transfer transistor that transfers the signal charges stored in the photoelectric conversion element to the floating junction, wherein at least one transfer transistor includes a gate electrode extended to cover a corresponding photoelectric conversion element.

According to another aspect of the present invention, there is provided a solid-state imaging device comprising: a plurality of pixels, each pixel comprising: a photoelectric conversion element that is provided in a semiconductor substrate and performs photoelectric conversion of incident light to store signal charges; a floating junction that is provided in the semiconductor substrate in the proximity of the photoelectric conversion element and temporarily stores signal charges; and a transfer transistor that transfers the signal charges stored in the photoelectric conversion element to the floating junction, wherein the floating junction is electrically connected with a plurality of photoelectric conversion elements through corresponding transfer transistors in such a manner that the floating junction is shared by the plurality of photoelectric conversion elements, and wherein at least one transfer transistor includes a gate electrode extended to cover corresponding photoelectric conversion element.

BRIEF DESCRIPTION OF THE SEVERAL VIEWS OF THE DRAWINGS

FIGS. 4A and 4B show examples of a cross-sectional view of the solid-state imaging device according to the first embodiment.

FIGS. 6A and 6B show examples of a cross-sectional view of the solid-state imaging device according to the modification 1;

FIG. 9 is a plan view showing an example of a solid-state imaging device according to modification 2 of the present invention;

DETAILED DESCRIPTION OF THE INVENTION

Figure 1:
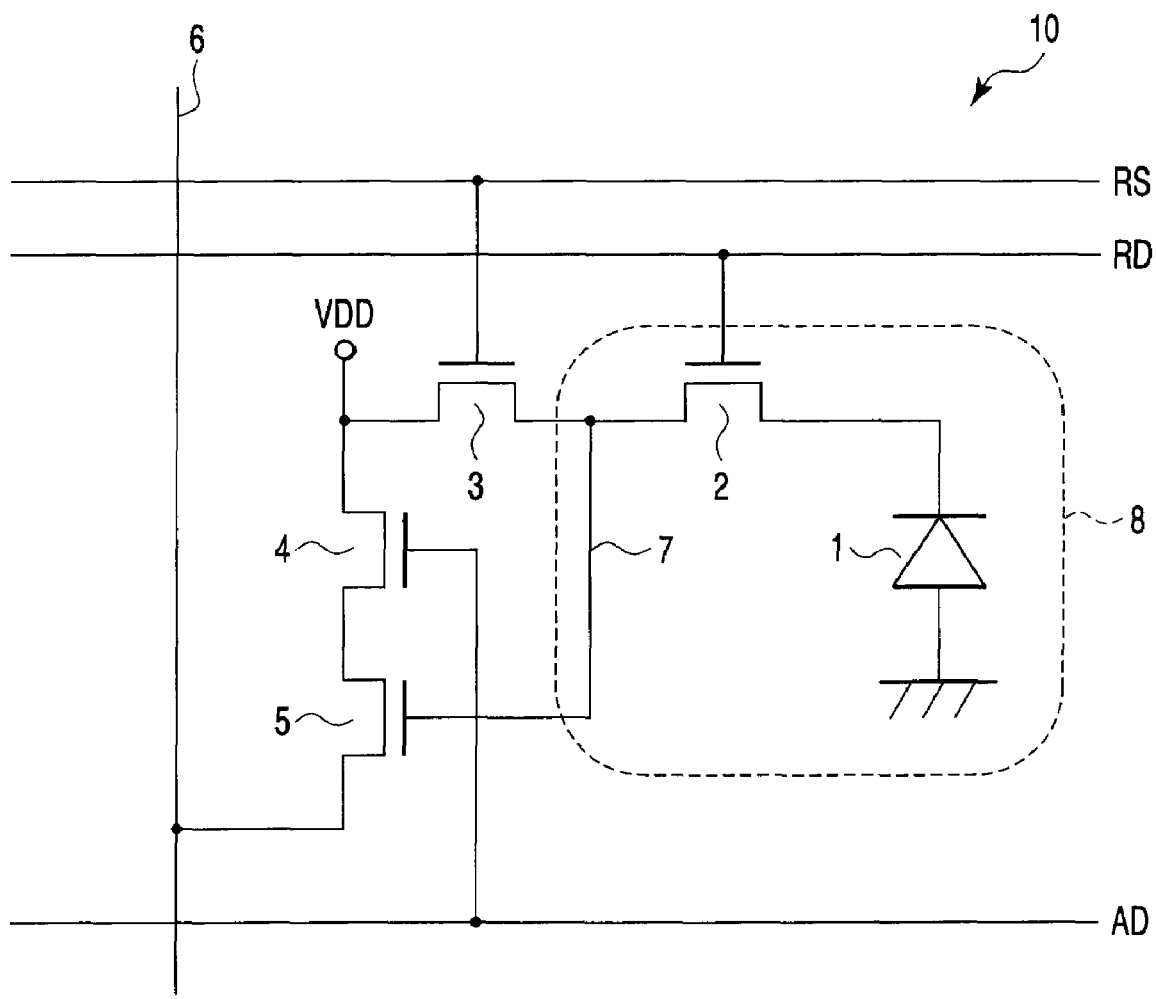
FIG. 1 shows an example of a pixel circuit configuration for explaining a solid-state imaging device according to a first embodiment of the present invention.

Embodiments according to the present invention provide a solid-state imaging device that suppresses crosstalk of light in a semiconductor substrate that caused by diffraction of light.

Diffraction of light cased by a single opening, such as diffraction of incident light by an opening between gate electrodes of photoelectric conversion elements in a solid-state imaging device, can be explained based on Fraunhofer diffraction. In Fraunhofer diffraction, assuming that $\lambda$ is a wavelength of incident light, w is a width of an opening, and L is a distance between the opening and an irradiation plane, a position x at which an intensity of a ±m-th order diffracted light ($m \neq 0$) takes a maximal value can be given by the following expression;

$$x \cong (m-½)(\lambda L/w).$$

Further, an angle (a diffraction angle) $\theta$ formed between a central axis of the ±m-th order diffracted light and an optical axis of the incident light can be given by the following expression;

$$\tan \theta = x/L = (m-½)(\lambda/w).$$

When the diffracted light is propagated through a semiconductor substrate to reach an active element, e.g., a neighboring floating junction or a pixel (or a photoelectric conversion element), crosstalk of light occurs.

The crosstalk has wavelength dependence. In lights in a visible light region, a long-wavelength light tends to produce a larger crosstalk than a short-wavelength light. That is because an absorption coefficient of light in a semiconductor substrate, e.g., a silicon substrate, varies depending on wavelength. That is since the short-wavelength light has a larger absorption coefficient in the semiconductor substrate, the diffracted light is readily attenuated and thereby hard to reach a neighboring active element. However, since the long-wavelength light has a relatively small absorption coefficient, the diffracted light is hard to be attenuated in the semiconductor substrate, thereby easily reaching the neighboring active element.

According to the solid-state imaging device of the embodiment of the present invention, when a gate electrode of a transfer transistor is extended to cover a photoelectric conversion element, it can be provided a structure that can prevent a diffraction phenomenon of light caused at an edge of the gate electrode and suppress the crosstalk of light in a semiconductor substrate.

The embodiments of the present invention will be described with reference to the accompanying drawings. Throughout the drawings, corresponding portions are denoted by corresponding reference numerals. Each of the following embodiments is illustrated by way of example, however, the present invention can be variously modified and implemented without departing from the spirit of the present invention.

First Embodiment

A solid-state imaging device according to a first embodiment of the present invention has a structure in which a gate electrode of a transfer transistor adjacent to a photoelectric conversion element of each pixel is extended and formed to cover the photoelectric conversion element and not to provide any opening on the photoelectric conversion element.

FIG. 1 shows an example of a pixel circuit configuration of a solid-state imaging device, e.g., a CMOS image sensor. FIG. 1 shows a pixel circuit adopting a one-pixel/one-cell mode. One pixel 10 includes a photoelectric conversion element 1, a pixel region 8 including a transfer transistor 2 and a floating junction 7, a rest transistor 3, an address transistor 4, and an amplification transistor 5.

When light enters the pixel 10, the photoelectric conversion element 1 photoelectrically converts the incident light and stores signal charges. When a transfer signal RD is input to a gate electrode of the transfer transistor 2, the stored signal charges are transferred from the photoelectric conversion element 1 to the floating junction 7 via a channel of the transfer transistor 2. It is to be noted that, prior to this transfer, a reset signal RS is input to a gate electrode of the reset transistor 3, and the potential of the floating junction 7 is reset to a drain voltage VDD of the reset transistor 3 in advance. By transferring the signal charges from the photoelectric conversion element 1 to the floating junction 7, the potential of the floating junction 7 changes. The floating junction 7 is connected with a gate electrode of the amplification transistor 5, and the change in the potential modulates a channel of the amplification transistor 5. Then, an address signal AD is input to a gate electrode of the address transistor 4. As a result, a signal corresponding to channel modulation in the amplification transistor 5 is output to a signal line 6. In this manner, a signal corresponding to an amount of the incident light is read. After outputting the signal, the potential of the floating junction 7 is reset to the drain voltage VDD of the reset transistor 3.

Figure 2:
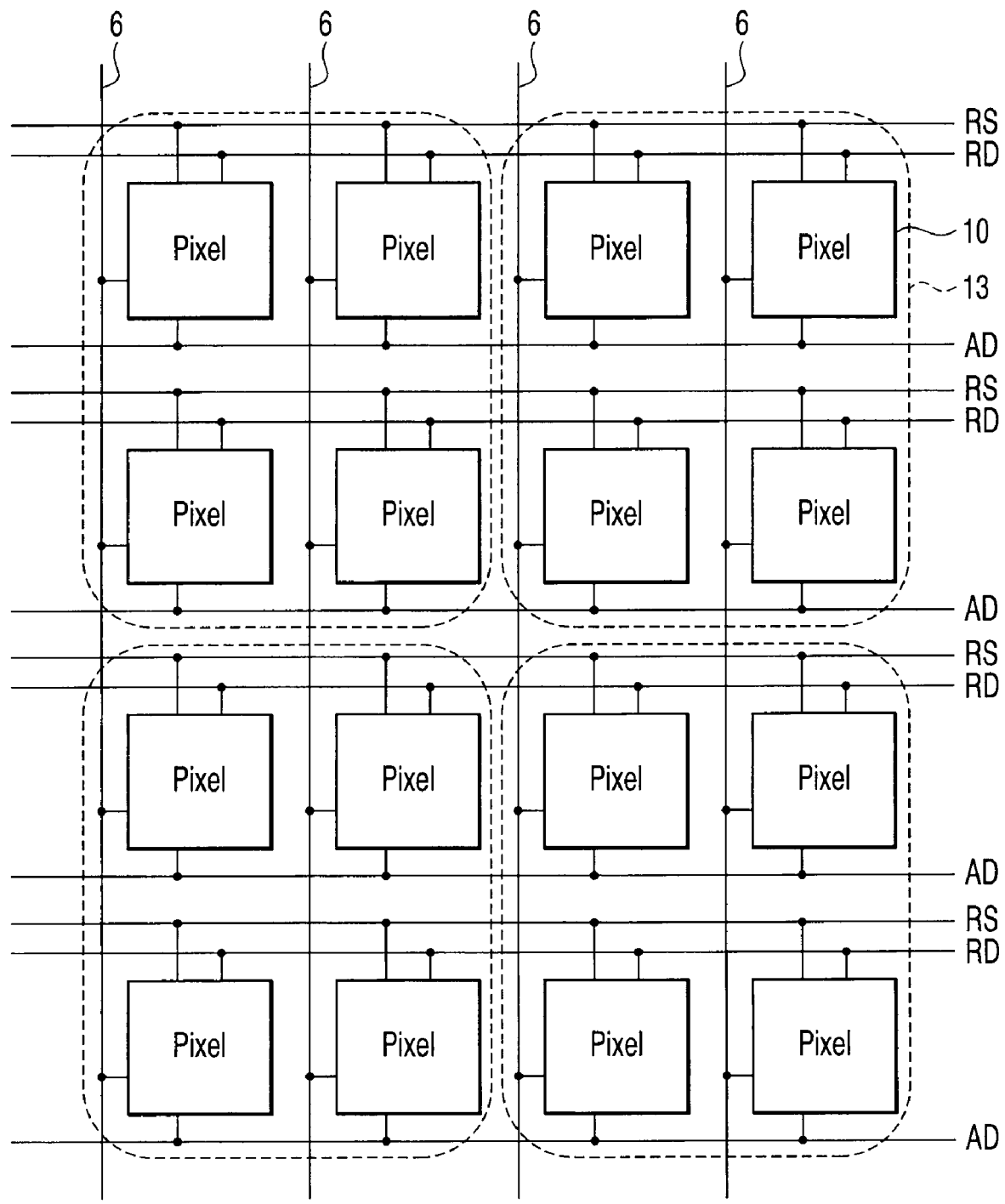
FIG. 2 shows an example of a pixel array for explaining the solid-state imaging device according to the first embodiment.

FIG. 2 shows an example of a pixel array in which the pixels 10 are two-dimensionally arranged. In the case of a color solid-state imaging device, generally, the four pixels 10 constitute a single unit cell 13. It is to be noted that the number of the pixels constituting one unit cell is not limited to four, and any number of pixels may be included in the unit cell. FIG. 2 shows the pixels 10 aligned in four rows and four columns, i.e., the unit cells 13 aligned in two rows and two columns. An RD line through which a transfer signal is supplied, an RS line through which a reset signal is supplied, and an AD line through which an address signal is supplied are horizontally arranged with respect to each pixel 10. A signal line 6 is vertically arranged with respect to each pixel 10. Each unit cell 13 includes a red (R) pixel, a green (Gr) pixel, a green (Gb) pixel, and a blue (B) pixel. Incident light is selectively limited to a wavelength range that differs depending on a filter corresponding to each pixel, and visible light in a different wavelength region enters each pixel.

Figure 3:
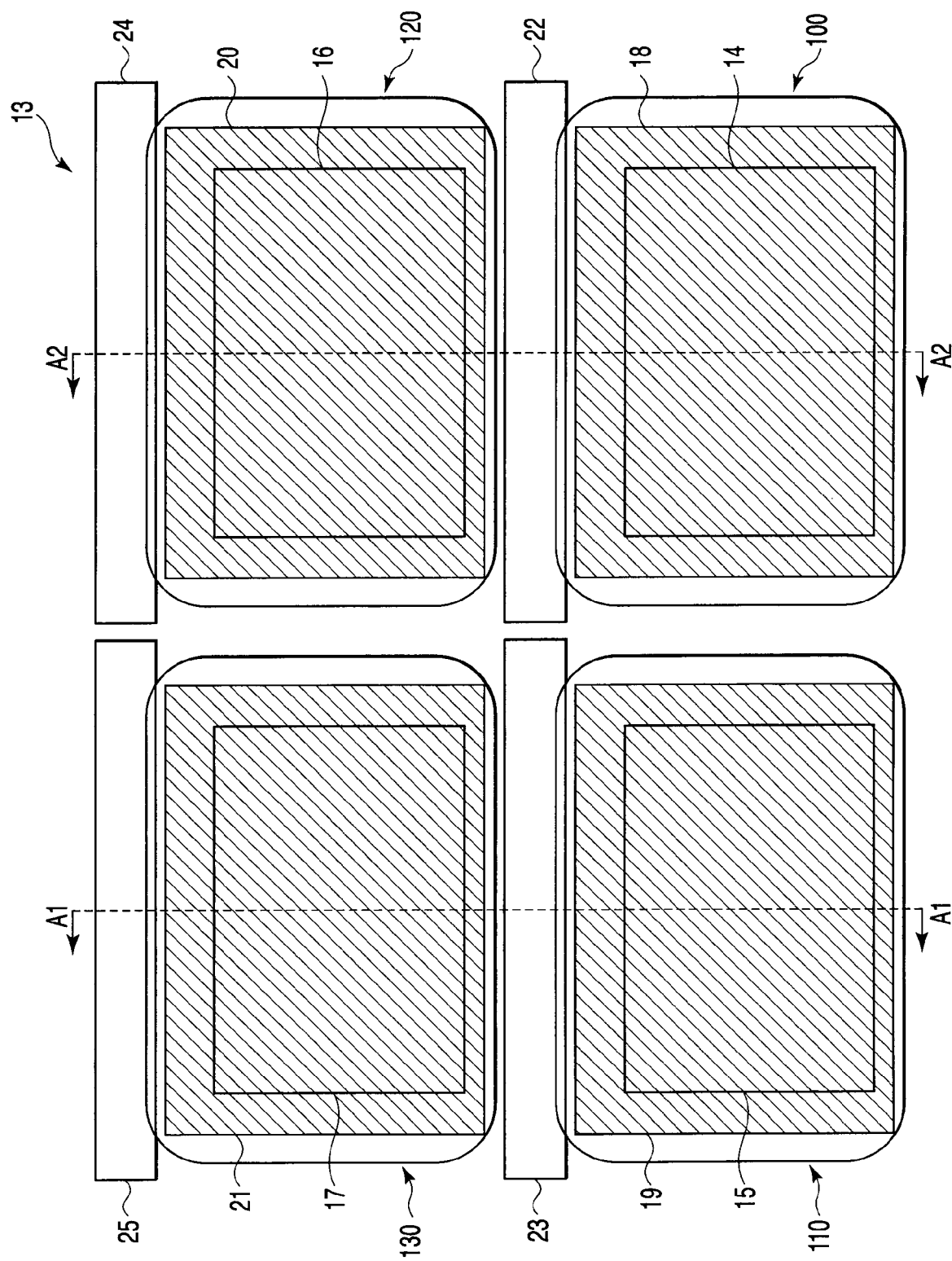
FIG. 3 is a plan view showing an example of the solid-state imaging device according to the first embodiment.

An example of the unit cell according to this embodiment will now be explained with reference to FIGS. 3, 4A and 4B. FIG. 3 is a plan view showing an example of the unit cell according to this embodiment, and FIGS. 4A and 4B are cross-sectional views taken along cutting-plane lines A1-A1 and A2-A2 depicted in FIG. 3, respectively. FIG. 3 shows the pixel region 8 alone depicted in FIG. 1 for simplicity. The unit cell 13 includes a red (R) pixel 100, a green (Gr) pixel 110, a green (Gb) pixel 120, and a blue (B) pixel 130. The respective pixels include photoelectric conversion elements 14 to 17 provided in a semiconductor substrate 30, transfer transistors 26 to 29 provided to be adjacent to the photoelectric conversion elements 14 to 17, and floating junctions 22 to 25 provided in the semiconductor substrate 30. The floating junctions 22 to 25 are electrically connected with corresponding photoelectric conversion elements 14 to 17 through the transfer transistors 26 to 29. The photoelectric conversion elements 14 to 17 photoelectrically convert incident lights and store signal charges. The transfer transistors 26 to 29 control the transfer of the signal charges from the photoelectric conversion elements 14 to 17 to the floating junctions 22 to 25. Gate electrodes 18 to 21 of the transfer transistors are extended to cover the upper side of the photoelectric conversion elements 14 to 17, respectively. In this regard, the structure of the embodiment is different from that of conventional pixels. Further, an insulating film 31 is formed over the transfer transistor gate electrodes 18 to 21, and metal wiring lines 32 are embedded in the insulating film 31 above the transfer transistors 26 to 29. Furthermore, microlenses 35 to 38 are provided on the insulating film 31 at positions corresponding to the respective photoelectric conversion elements 14 to 17.

Incident lights 39 to 42 are condensed by the microlenses 35 to 38, pass through spaces between the metal wiring lines 32, and enter the photoelectric conversion elements 14 to 17 through the transfer transistor gate electrodes 18 to 21. As shown in FIGS. 4A and 4B, openings of the transfer transistor gate electrodes 18 to 21 are not present in a condensed incident light irradiating region on a surface of the semiconductor substrate 30, i.e., the photoelectric conversion elements 14 to 17, thereby preventing the incident lights from being diffracted by the gate electrodes 18 to 21.

The transfer transistor gate electrodes 18 to 21 must allow sufficient transmission of incident lights therethrough and enable relatively easy manufacture of the solid-state imaging device. Considering absorption of visible light in the electrode, an electroconductive material allowing transmission of the visible light, e.g., silicon (Si) or a silicon carbide (SiC) having a larger band gap than Si, can be used as an electrode material.

When a film thickness of the gate electrode of the transfer transistor becomes thicker, the absorption of light in that gate electrode becomes larger. Therefore, the gate electrode having a reduced thickness as much as possible is preferable. However, when the film thickness is too thin, a pin hole may be formed in the gate electrode, or a via contact pierces the gate electrode when forming the via contact on the gate electrode. A minimum film thickness of the gate electrode that can avoid such problems is, e.g., 50 nm in the case of Si.

As explained above, according to this embodiment, when the transfer transistor gate electrode of each pixel is extended to cover the photoelectric conversion element, the incident light can be prevented from being diffracted. As a result, it can be provided the solid-state imaging device that suppresses crosstalk of light in the semiconductor substrate to the neighboring active element with respect to each pixel.

(Modification 1)

According to the first embodiment, since the transfer transistor gate electrodes are provided to cover the photoelectric conversion elements in all the pixels, i.e., the R pixel, the Gr pixel, the Gb pixel, and the B pixel, there is a concern that sensitivities of the pixels are degraded due to a light absorption loss in the transfer transistor gate electrodes. In particular, a pixel corresponding to a short-wavelength region of the visible light which has a relatively larger absorption in the gate electrode, especially the B pixel has a concern that a light absorption loss increases.

According to Modification 1, a thickness of the transfer transistor gate electrode of the B pixel is formed thinner than that in the structure of the first embodiment and those of the other pixels. As a result, the light absorption loss in the B pixel can be reduced.

Figure 5:
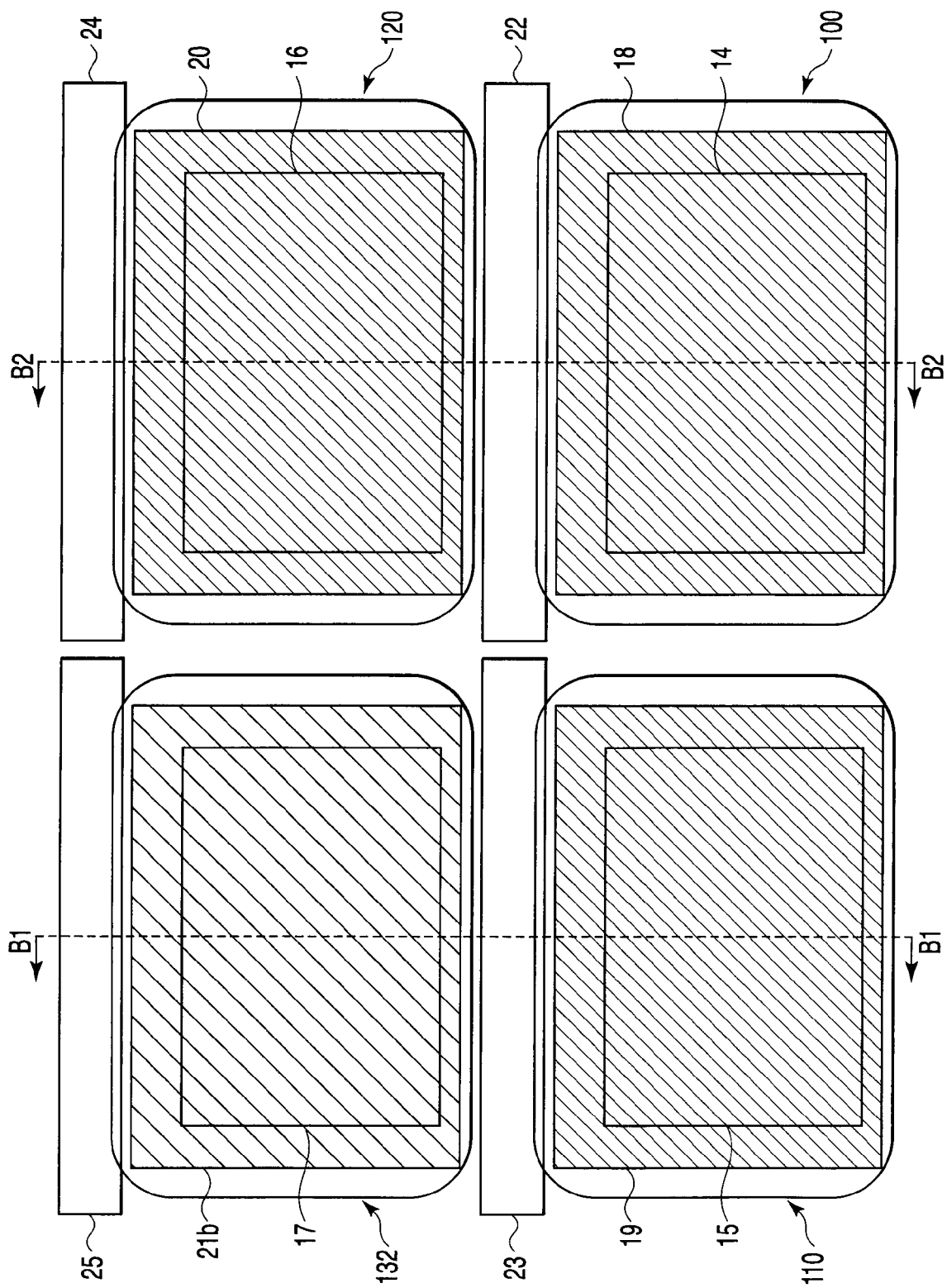
FIG. 5 is a plan view showing an example of a solid-state imaging device according to modification 1 of the present invention.

A solid-state imaging device according to this modification will now be explained with reference to FIGS. 5, 6A, and 6B. FIG. 5 is a plan view showing an example of a unit cell according to this modification, and FIGS. 6A and 6B are cross-sectional views taken along cutting-plane lines B1-B1 and B2-B2 depicted in FIG. 5, respectively. FIGS. 5, 6A, and 6B show the similar configuration as those depicted in FIGS. 3, 4A, and 4B, and the configuration includes an R pixel 100, a Gr pixel 110, a Gb pixel 120, and a B pixel 132.

As shown in FIG. 6A, according to this modification, a film thickness of a transfer transistor gate electrode 21b of the B pixel 132 is formed thinner than those of transfer transistor gate electrodes 18 to 20 of the other R pixel 100, Gr pixel 110, and Gb pixel 120. When incident lights 39 to 42 enter the respective pixels, the absorption loss of the incident light in the B pixel can be reduced since the film thickness of the transfer transistor gate electrode 21b covering a photoelectric conversion element 17 of the B pixel is thinned.

The thickness of the transfer transistor gate electrode 21b covering the B pixel 132 can be set in such a manner that the transmitted light intensity becomes substantially equal based on absorption of the light in each gate electrode, for example. Although wavelengths of lights that enter the R pixel, the Gr pixel, the Gb pixel, and the B pixel vary depending on filters used, a central wavelength of the light entering the R pixel is, e.g., 600 nm. A central wavelength of the light entering each of the Gr pixel and the Gb pixel is, e.g., 500 to 550 nm, and the same entering the B pixel is, e.g., 450 nm. For example, a transmittance of light having a wavelength of 600 nm is 90% in a silicon film of 200 nm thick, after S. M. Sze ("Physics of Semiconductor Devices, Second Edition," John Wiley & Sons, p. 750, FIG. 5, 1981). For a transmittance of light having a wavelength of 450 nm, substantially the same transmittance can be obtained for a silicon film of 50 nm thick. Therefore, when the silicon film thickness of the gate electrode of the R pixel and B pixel are respectively set to 200 nm and 50 nm, substantially the same effective transmittance can be obtained for R pixel and B pixel.

Furthermore, since an opening is not present in an incident light irradiating regions on the surface of the semiconductor substrate 30, the incident lights 39 to 42 can be prevented from being diffracted by the edges of the transfer transistor gate electrodes 18 to 21b.

In this modification, only the film thickness of the transfer transistor gate electrode covering the B pixel is thinned taking into account absorption of the light. Similarly, thicknesses of the transfer transistor gate electrodes covering the Gr pixel and the Gb pixel can be thinned according to their respective absorption of the lights. When the film thickness of each transistor gate electrode is adjusted in such a manner, the transmittances of the lights can be effectively set equal to each other in all the pixels.

As explained above, in this modification, as in the first embodiment, when the transfer transistor gate electrode of each pixel is extended to cover the photoelectric conversion element, the incident light can be prevented from being diffracted. Moreover, the sensitivity of the B pixel receiving light in a short-wavelength region having the most serious concern about the light absorption loss in the gate electrode can be reduced from being deteriorated. As a result, it can be provided the solid-state imaging device that suppresses crosstalk of light in the semiconductor substrate to the neighboring active element with respect to each pixel.

Second Embodiment

According to a solid-state imaging device of a second embodiment of the present invention, except a B pixel that is least affected by crosstalk of light, transfer transistor gate electrodes of three pixels, i.e., an R pixel, a Gr pixel, and a Gb pixel, are extended to cover photoelectric conversion elements, thereby avoiding the incident light from being diffracted.

Figure 7:
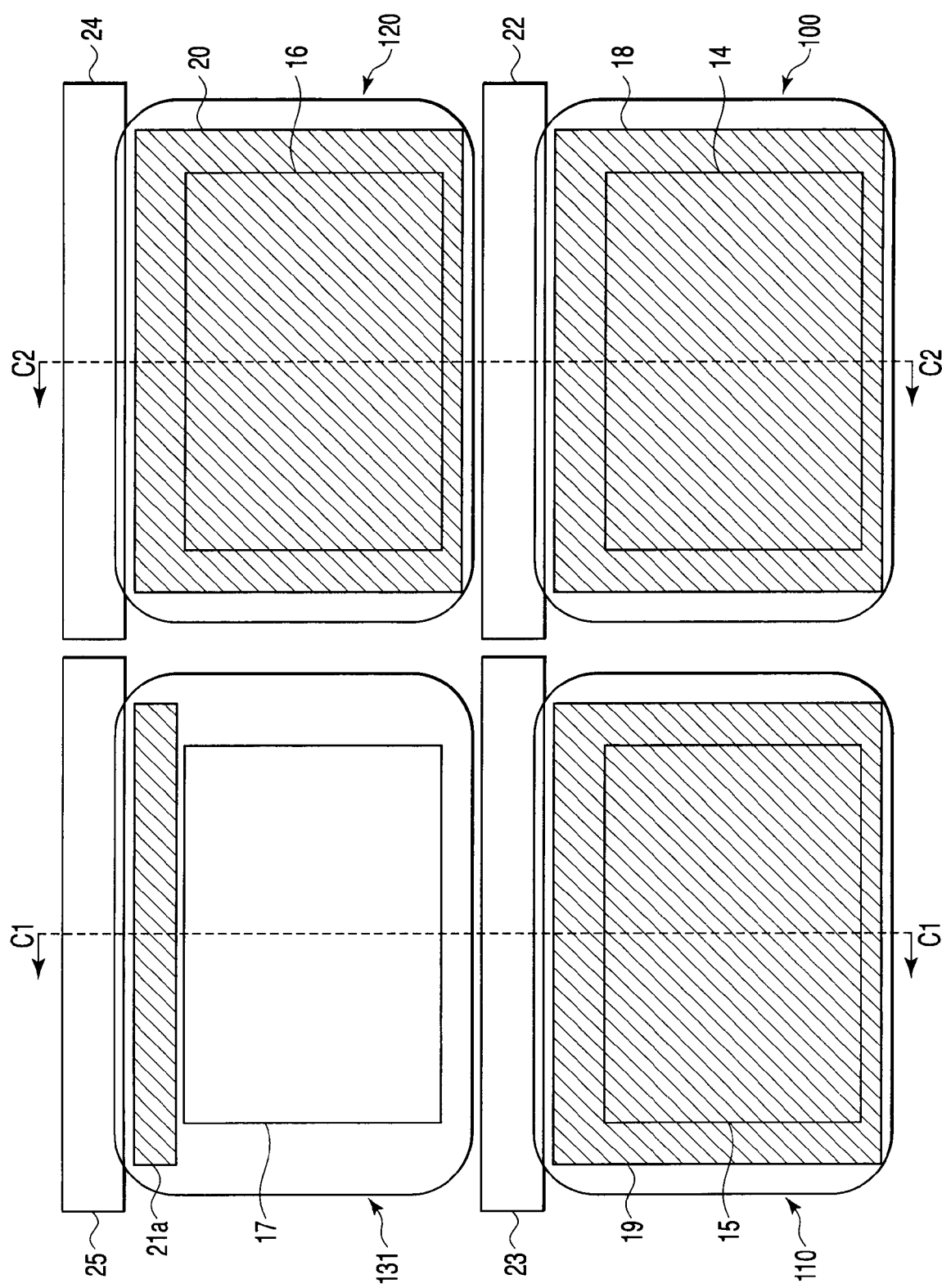
FIG. 7 is a plan view showing an example of a solid-state imaging device according to a second embodiment of the present invention.
Figure 8B:
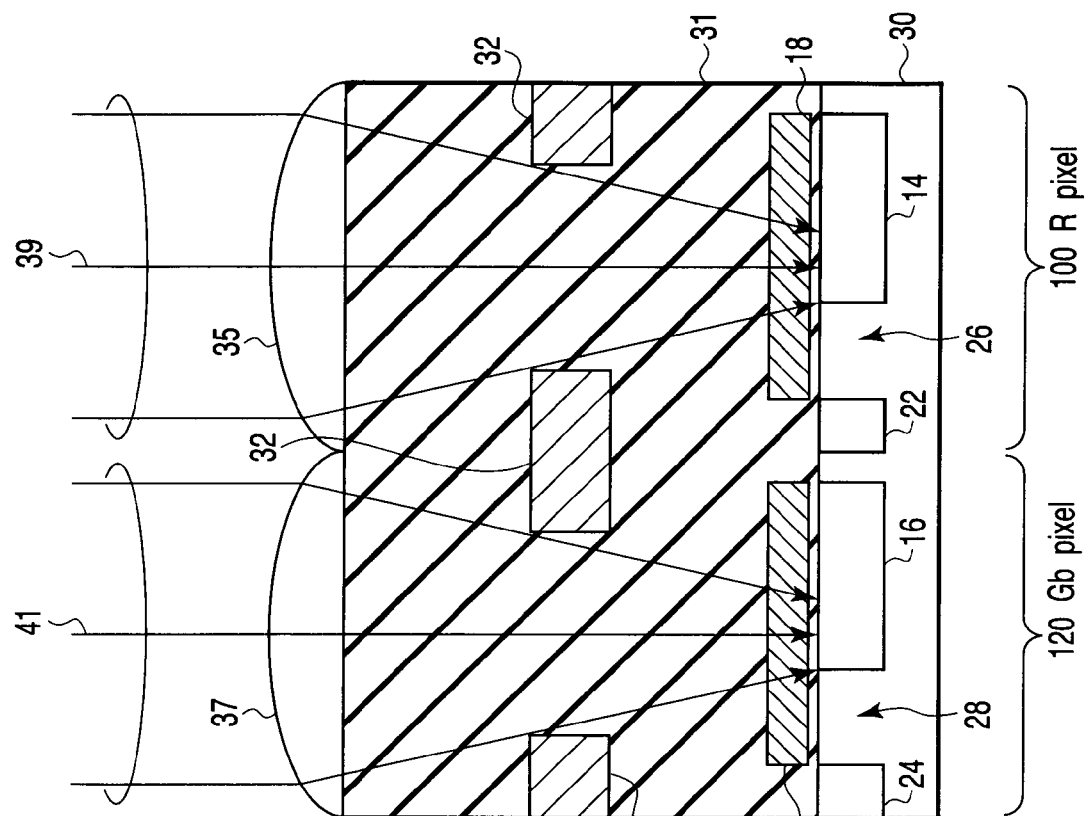
FIGS. 8A and 8B show examples of a cross-sectional view of the solid-state imaging device according to the second embodiment.
Figure 8A:
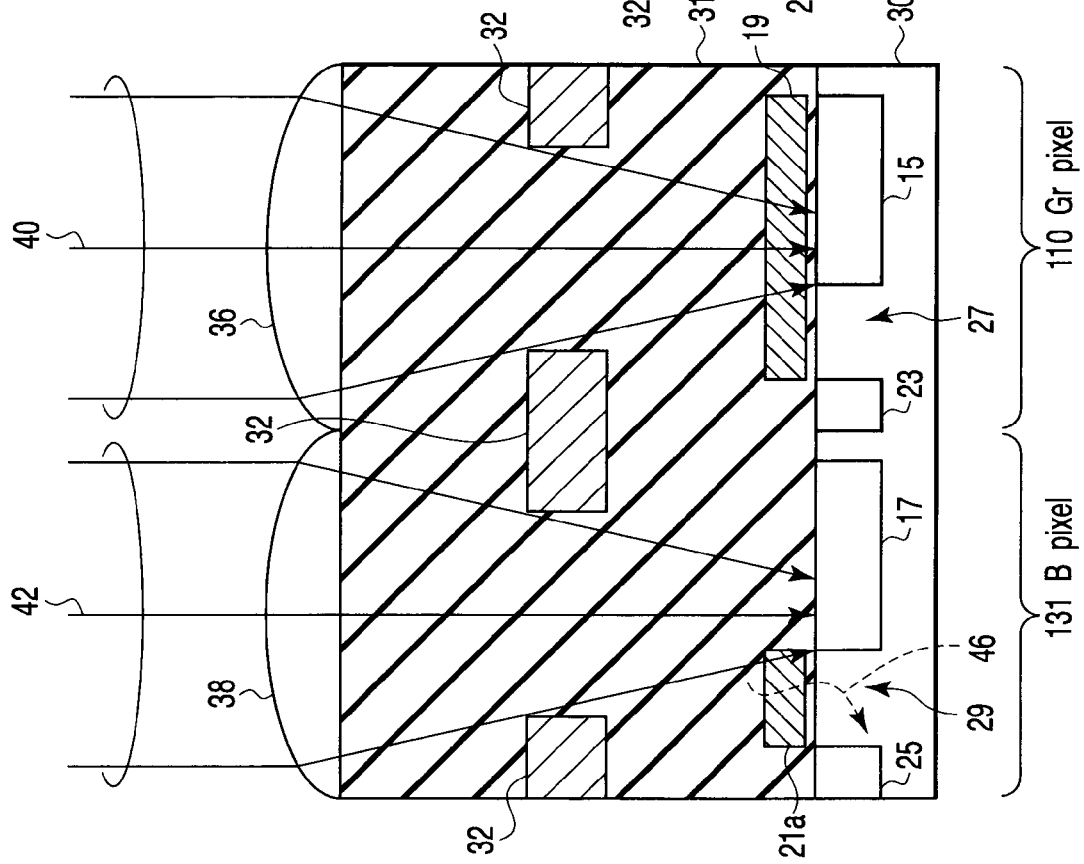

An example of a unit cell according to this embodiment will now be explained with reference to FIGS. 7, 8A, and 8B. FIG. 7 is a plan view showing an example of a unit cell according to this embodiment, and FIGS. 8A and 8B are cross-sectional views taken along cutting-plane lines C1-C1 and C2-C2 depicted in FIG. 7, respectively. FIG. 7 shows the pixel region 8 alone that is depicted in FIG. 1 for simplicity. The unit cell includes an R pixel 100, a Gr pixel 110, a Gb pixel 120, and a B pixel 131. The respective pixels include photoelectric conversion elements 14 to 17 provided in a semiconductor substrate 30, transfer transistors 26 to 29 provided to be adjacent to the photoelectric conversion elements 14 to 17, and floating junctions 22 to 25 provided in the semiconductor substrate 30. Only gate electrodes 18 to 20 of the transfer transistors 26 to 28 of the R pixel 100, the Gr pixel 110, and the Gb pixel 120 are extended above the semiconductor substrate 30 to cover the photoelectric conversion elements 14 to 16. In this regard, the pixel structure according to this embodiment is different from that according to the first embodiment.

According to this embodiment, as explained above, a transfer transistor gate electrode 21a of the B pixel 131 is reduced in size so that it is provided at a position adjacent to the photoelectric conversion element 17, thus the photoelectric conversion element 17 is not covered with the transfer transistor gate electrode 21a. As a result, unlike the first embodiment, the absorption loss of incident light caused by the transfer transistor gate electrode 21a provided to cover the photoelectric conversion element 17 in the B pixel 131 in a short-wavelength region can be avoided, thereby preventing a sensitivity of the B pixel 131 from being lowered.

When lights enter the solid-state imaging device according to this embodiment, incident lights 39 to 41 for the R pixel 100, the Gr pixel 110, and the Gb pixel 120 can be prevented from being diffracted since an opening is not present in an incident light irradiating region on a surface of the semiconductor substrate 30. As an opening is present in the transfer transistor gate electrode 21a of the B pixel 131 at the incident light irradiating region on the surface of the semiconductor substrate 30, incident light 42 entering the B pixel 131 may be diffracted at an edge of the transfer transistor gate electrode 21a, thereby causing diffracted light 46.

However, the light entering the B pixel 131 is a component having the shortest wavelength in visible light among the pixels, and it is greatly absorbed in the semiconductor substrate 30. Therefore, the diffracted light 46 is readily attenuated in the semiconductor substrate 30 and thereby hard to reach a neighboring active element. Therefore, crosstalk in the B pixel 131 is substantially small. Accordingly, since the transfer transistor gate electrode 21a does not cover the photoelectric conversion element 17, the structure of the B pixel 131 according to this embodiment is effective to avoid the light absorption loss in the transfer transistor gate electrode 21a of the B pixel 131.

As explained above, according to this embodiment, when the transfer transistor gate electrodes of the respective pixels except the B pixel are extended to cover the photoelectric conversion elements, the crosstalk caused by diffraction of the incident light can be substantially avoided, thus preventing image quality from being lowered as in the first embodiment. In addition, it can be avoided a reduction in sensitivity of the B pixel that receives light in the short-wavelength region and has the most serious concern about the light absorption loss by the gate electrode if the gate electrode is extended to cover the photoelectric conversion element. As a result, it can be provided the solid-state imaging device that suppresses crosstalk of light in the semiconductor substrate to the neighboring active element with respect to each pixel.

(Modification 2)

In the second embodiment, since the transfer transistor gate electrodes are provided to cover the photoelectric conversion elements of the three pixels, i.e., the R pixel, the Gr pixel, and the Gb pixel, there is a concern that a light absorption loss due to the transfer transistor gate electrodes occurs in these pixels thus their sensitivities are reduced. In particular, the absorption loss may be increased with respect to visible light in a shorter-wavelength region as compared with visible light in a longer-wavelength region, i.e., the light absorption loss may increase in each of the Gr pixel and the Gb pixel on the shorter-wavelength side.

Modification 2 provides a solid-state imaging device having a structure where transfer transistor gate electrodes of three pixel, i.e., a Gr pixel, a Gb pixel, and a B pixel are provided at positions adjacent to photoelectric conversion elements without being extended above the photoelectric conversion elements, and a transfer transistor gate electrode of an R pixel alone is extended to cover the photoelectric conversion element. As a result, a light absorption loss in each of the Gr pixel, the Gb pixel, and the B pixel can be avoided.

Figures 10A, 10B:
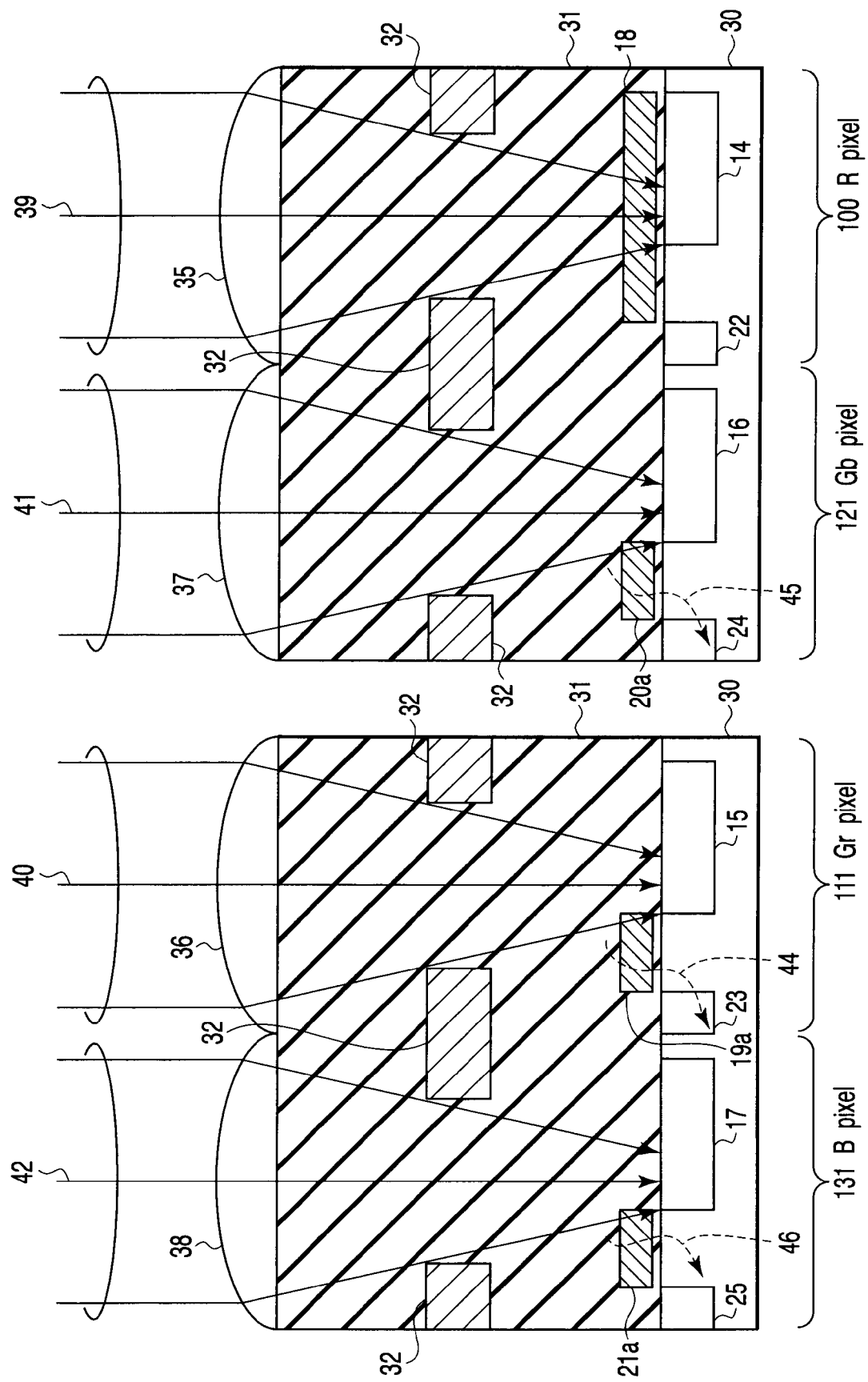
FIGS. 10A and 10B show examples of a cross-sectional view of the solid-state imaging device according to the modification 2.

The solid-state imaging device according to this modification will now be explained with reference to FIGS. 9, 10A, and 10B. FIG. 9 is a plan view showing an example of a unit cell according to this modification, and FIGS. 11A and 10B are cross-sectional views taken along cutting-plane lines D1-D1 and D2-D2 depicted in FIG. 9, respectively. FIGS. 9, 10A, and 10B show a similar configuration to that depicted in FIGS. 7, 8A, and 8B, and this configuration includes an R pixel 100, a Gr pixel 111, a Gb pixel 121, and a B pixel 131.

As shown in FIGS. 10A and 10B, transfer transistor gate electrodes 19a to 21a of the Gr pixel 111, the Gb pixel 121, and the B pixel 131 according to this modification are provided at positions adjacent to photoelectric conversion elements 15 to 17, and they do not cover the photoelectric conversion elements 15 to 17. A transfer transistor gate electrode 18 of the R pixel 100 alone is formed to extend above a photoelectric conversion element 14.

When incident lights 39 to 42 enter the respective pixels, the incident light 39 does not diffract in the R pixel 100 since an opening is not present in an incident light irradiating region of the R pixel on a surface of a semiconductor substrate 30. As to the incident lights 40 to 42 that enter other three pixels, i.e., the Gr pixel 111, the Gb pixel 121, and the B pixel 131, diffracted lights 44 to 46 are caused at edges of the transfer transistor gate electrodes 19a to 21a since openings are present in the incident light irradiating region of these three pixels on the surface of the semiconductor substrate 30.

However, the lights that enter the three pixels, i.e., the Gr pixel 111, the Gb pixel 121, and the B pixel 131, have wavelengths shorter than that of the light entering the R pixel 100, and hence absorption of these lights in the semiconductor substrate is relatively large. Therefore, the diffracted lights 44 to 46 are readily attenuated in the semiconductor substrate 30 and thereby hard to reach neighboring active elements. Thus, crosstalk due to diffracted lights in the Gr pixel 111, the Gb pixel 121, and the B pixel 131 is substantially small. Accordingly, the structure where the transfer transistor gate electrodes 19a to 21a do not cover the photoelectric conversion elements 15 to 17 of the Gr pixel 111, the Gb pixel 121, and the B pixel 131 according to this modification can avoid the light absorption loss due to the gate electrodes in the photoelectric conversion elements 15 to 17, and it is also an effective countermeasure for the crosstalk.

As explained above, according to this modification, when the transfer transistor gate electrode of the R pixel alone is extended to cover the photoelectric conversion element, the crosstalk that occurs due to diffraction of the incident light can be substantially avoided as in the second embodiment, thereby preventing image quality from being lowered. Further, the sensitivities of the Gr pixel, the Gb pixel, and the B pixel in the short-wavelength region having the concern about the light absorption loss due to the gate electrodes can be prevented from being reduced. As a result, it can be provided the solid-state imaging device that suppresses crosstalk of light in the semiconductor substrate to the neighboring active element with respect to each pixel.

Third Embodiment

Each of the first and the second embodiments and their modifications explained above provides the solid-state imaging device adopting the one-pixel/one-cell mode, but a third embodiment according to the present invention provides a solid-state imaging device adopting a two-pixel/one-cell mode that is suitable for high integration.

Figure 11:
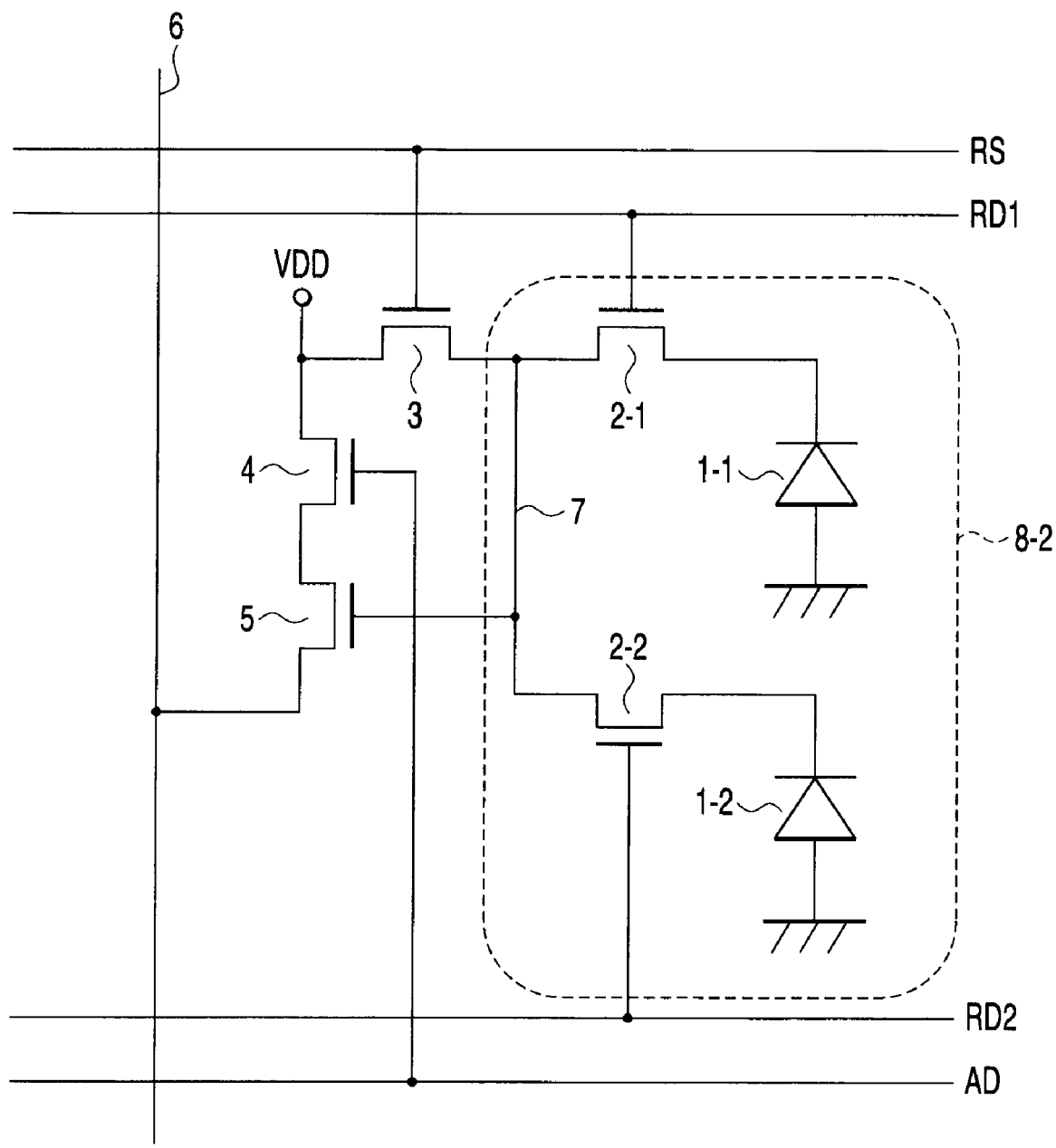
FIG. 11 shows an example of a pixel circuit configuration for explaining a solid-state imaging device according to a third embodiment of the present invention.

FIG. 11 shows an example of a pixel circuit configuration for explaining an operation of a solid-state imaging device adopting the two-pixel/one-cell mode. The two-pixel/one-cell mode solid-state imaging device is different from the one-pixel/one-cell mode device in that two photoelectric conversion elements 1-1 and 1-2 and two transfer transistors 2-1, 2-2 are included in a pixel region 8-2 and these members share one floating junction 7. As a result, the pixel circuit can reduce its component to include one of each floating junction 7, reset transistor 3, address transistor 4, and amplification transistor 5 to two pixels. Consequently, the proportion of an area of the photoelectric conversion elements in an occupied area of the unit cell can be increased, and hence high integration can be realized. An operation is basically the same as that in the one-pixel/one-cell mode, but charge signals stored in the photoelectric conversion elements 1-1 and 1-2 are alternately read.

A merit obtained by sharing the floating junction in this manner lies in that the number of transistors per pixel can be reduced, an aperture of the photoelectric conversion element can be increased, an advantage can be given on, e.g., high integration as compared with the one-pixel/one-cell mode, and others.

Figure 12:
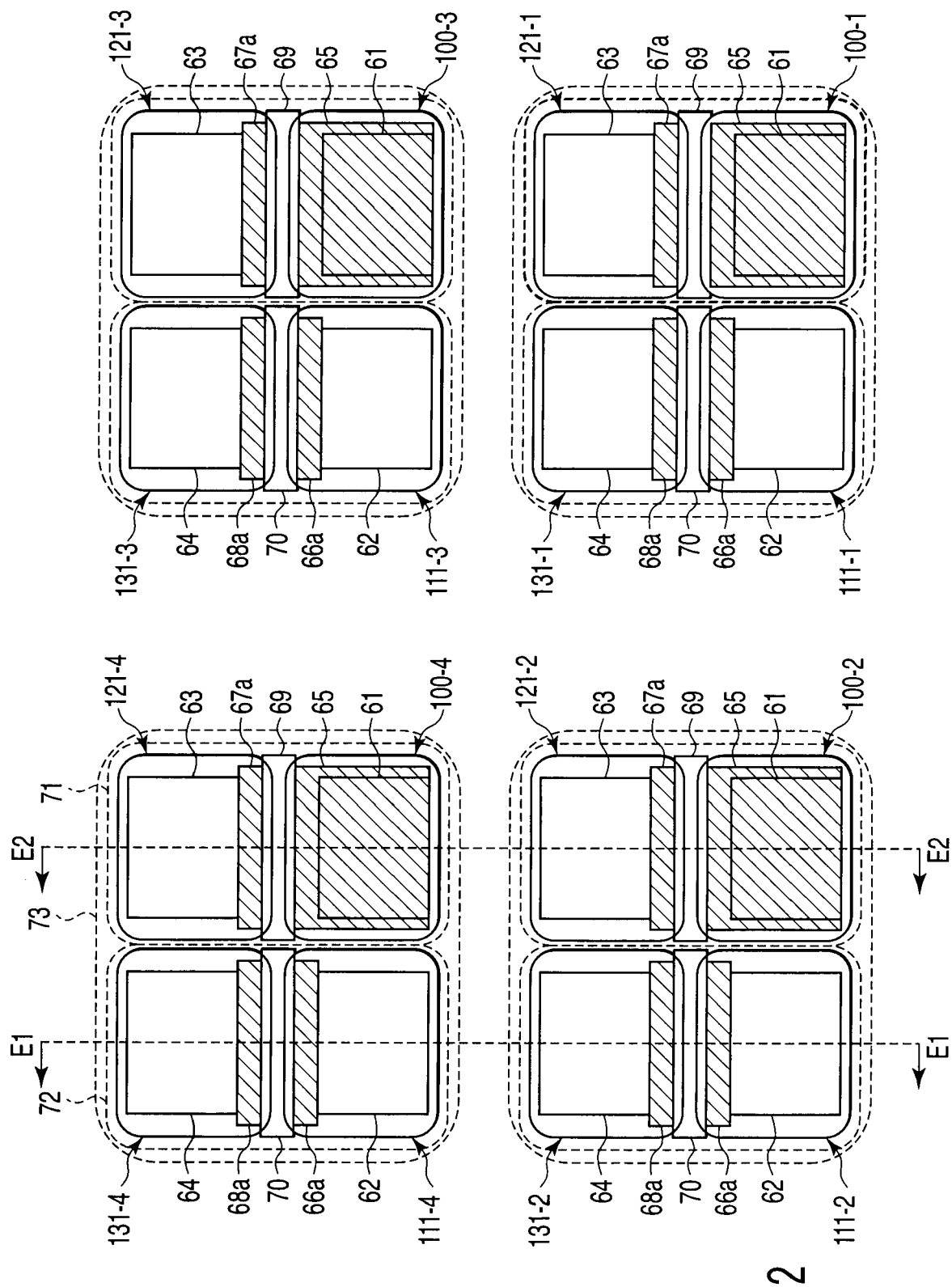
FIG. 12 is a plan view showing an example of the solid-state imaging device according to the third embodiment.

FIG. 12 shows an example of a pixel layout of a solid-state imaging device according to this embodiment. For simplicity, the drawing shows the pixel region 8-2 alone depicted in FIG. 11. Two two-pixel cells 71 and 72 constitute one unit cell 73. The two-pixel cell 71 includes two pixels, i.e., an R pixel 100 and a Gb pixel 121, and the two-pixel cell 72 includes another two pixels, i.e., a Gr pixel 111 and a B pixel 131. The drawing shows four unit cells, i.e., an array of 16 pixels formed of the two-pixel cells aligned in two rows and four columns. The R pixel 100 and the Gb pixel 121 share one floating junction 69, and the Gr pixel 111 and the B pixel 121 share another floating junction 70. Here, an example where each transfer transistor gate electrode is formed as in Modification 2 will be explained, but the present invention is not limited thereto. In this embodiment, a description will be given on a structure where a transfer gate transistor gate electrode 65 of the R pixel 100 alone is provided to cover a photoelectric conversion element 61 and transfer transistor gate electrodes 66a to 68a of the Gr pixel 111, the Gb pixel 121, and the B pixel 131 are provided to be respectively adjacent to corresponding photoelectric conversion elements 62 to 64.

Figure 13:
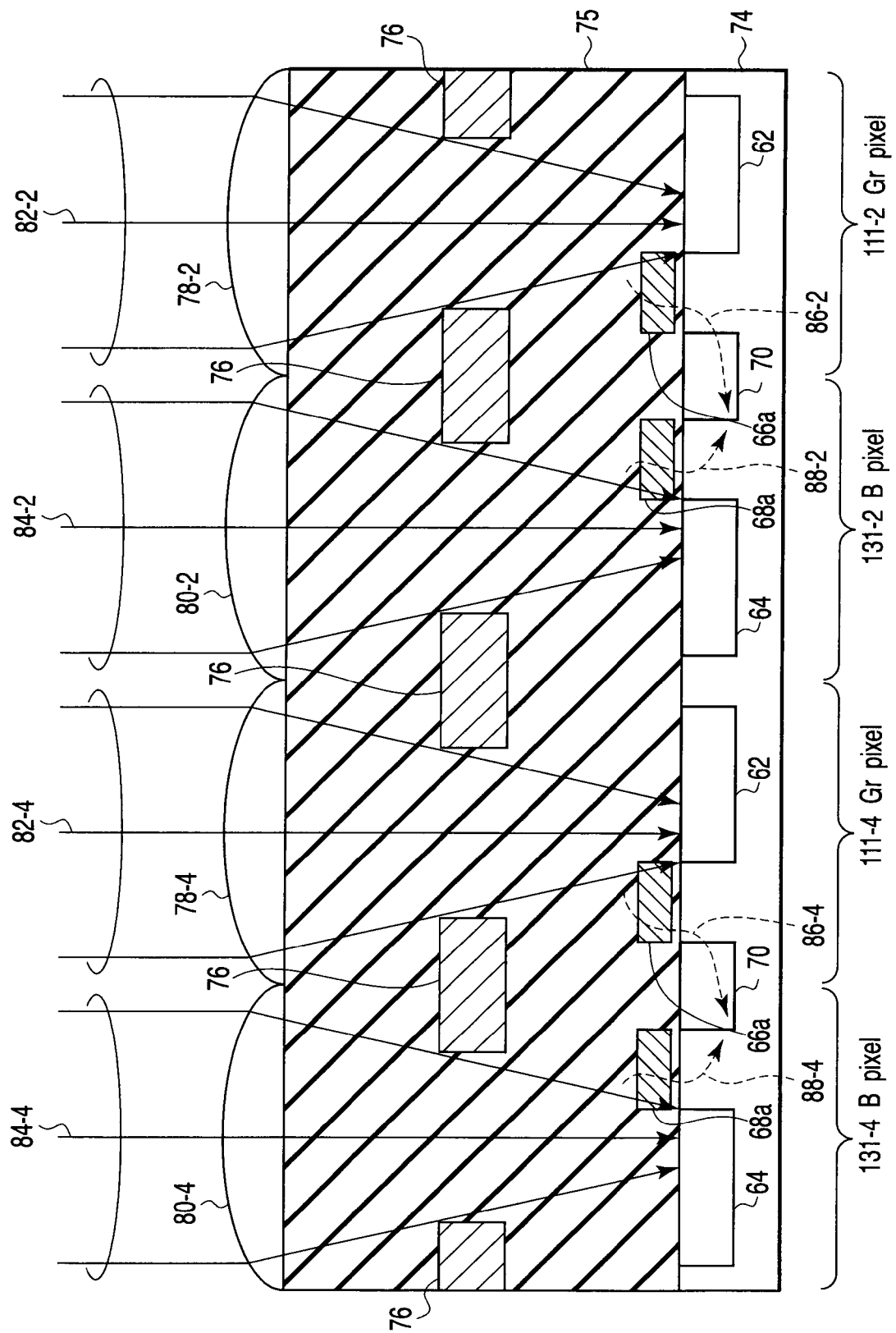
FIG. 13 shows an example of a cross-sectional view of the solid-state imaging device according to the third embodiment.
Figure 14:
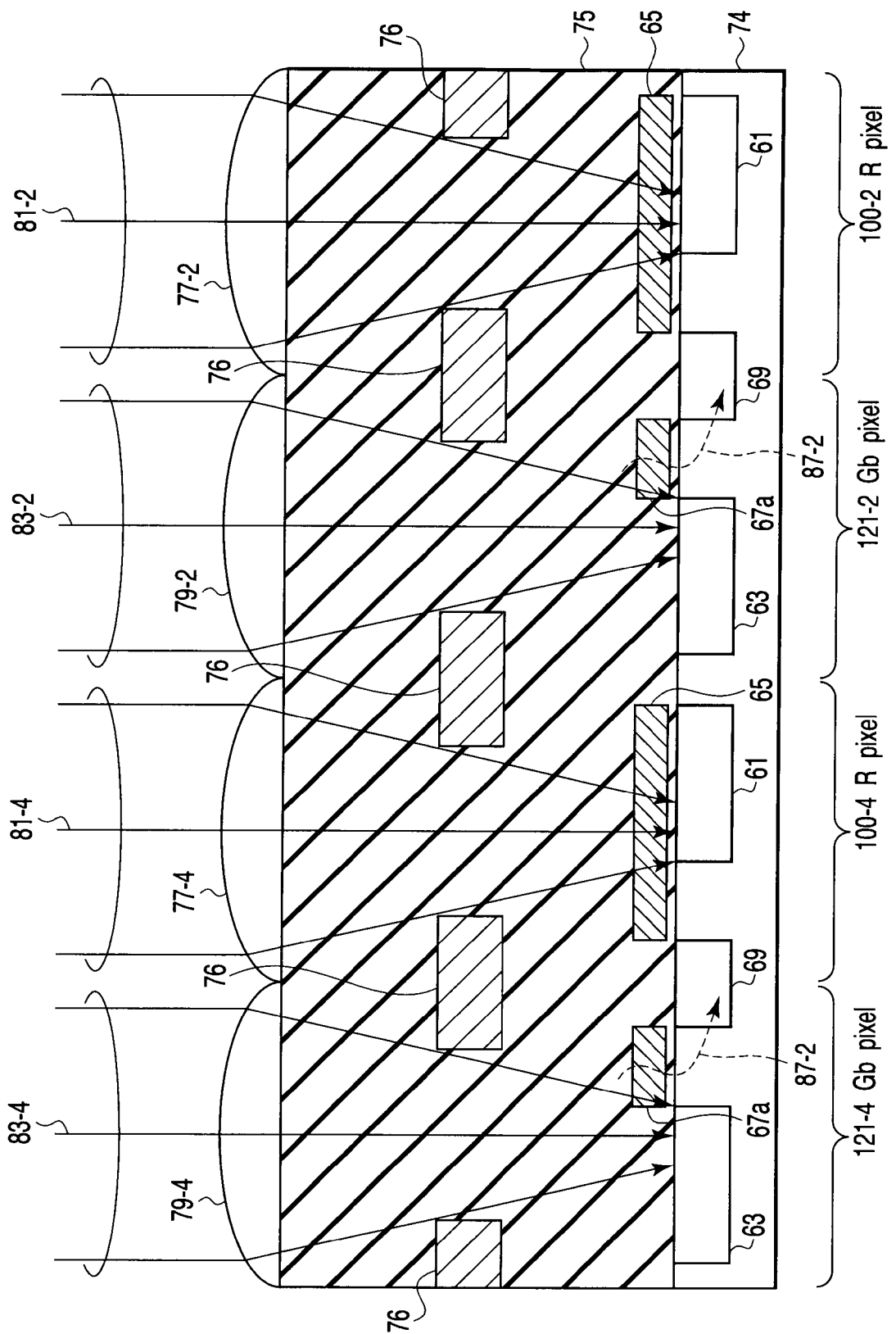
FIG. 14 shows an example of a cross-sectional view of the solid-state imaging device according to the third embodiment.

FIGS. 13 and 14 are views for explaining a cross-sectional structure of each pixel, and they are cross-sectional views taken along cutting-plane lines E1-E1 and E2-E2 depicted in FIG. 12, respectively. The respective photoelectric conversion elements 61 to 64 of the R pixel 100, the Gr pixel 111, the Gb pixel 121, and the B pixel 131 are provided in a semiconductor substrate 74. The transfer transistor gate electrode 65 of the R pixel 100 is provided to cover the photoelectric conversion element 61, and the transfer transistor gate electrodes 66a to 68a of the Gr pixel 111, the Gb pixel 121, and the B pixel 131 are provided adjacent to corresponding photoelectric conversion elements 62 to 64. The transfer transistor gate electrodes 65 and 67a are oppositely and adjacently provided to sandwich the floating junction 69, and the transfer transistor gate electrodes 66a and 68a are oppositely and adjacently provided to sandwich the floating junction 70. The floating junctions 69 and 70 are provided in the semiconductor substrate 74 to be respectively shared by the pair of pixels 100 and 121 and another pair of pixels 111 and 131.

An insulating film 75 is formed over the semiconductor substrate 74 and the transfer transistor gate electrodes 65 and 66a to 68a, and metal wiring lines 76 are embedded in the insulating film 75 above the transfer transistor gate electrodes 65 and 66a to 68a. Further, microlenses 77 to 80 are provided on the insulating film 75.

As shown in FIGS. 13 and 14, when incident lights 81 to 84 enter the respective pixels, the incident light 81 entering the R pixel 100 can be prevented from being diffracted by the transfer transistor gate electrode 65 of the R pixel 100 since no opening is present in an incident light irradiating region on a surface of the semiconductor substrate 74. The incident lights 82 to 84 that enter the Gr pixel 111, the Gb pixel 121, and the B pixel 131 cause diffracted lights 86 to 88 since openings are present in the transfer transistor gate electrodes 66a to 68a provided in the incident light irradiating region on the surface of the semiconductor substrate 74. However, in the Gr pixel 111, the Gb pixel 121, and the B pixel 131, these diffracted lights 86 to 88 are greatly attenuated in the semiconductor substrate 74 as explained in conjunction with Modification 2. Therefore, crosstalk of lights in the pixels 111 to 131 is sufficiently small, and hence this embodiment can provide an effective countermeasure for the crosstalk.

Although the each transfer transistor gate electrode has been explained herein by using the example where it is formed as in Modification 2, this embodiment can also be applied to other transfer transistor gate electrode structure, such as described in any one of the first and the second embodiments, Modifications 1 and 2, and any other structure designed to provide the functions equivalent to those in the present structure.

Furthermore, in this embodiment, the example where the single floating junction is shared by the two pixels has been explained. However, the floating junctions 69 and 70 can be connected with each other to provide a four-pixel/one-cell mode where one floating junction is shared by the four pixels 100, 111, 121, and 131 in FIG. 12, for example.

As explained above, according to this embodiment, in the solid-state imaging device adopting the two-pixel/one-cell mode, when the transfer transistor gate electrode of the R pixel alone is extended to cover the photoelectric conversion element, the crosstalk caused by diffraction of the incident light can be substantially avoided as in the second embodiment, thereby preventing image quality from being lowered. Moreover, in the Gr pixel, the Gb pixel, and the B pixel in a shorter-wavelength region having a concern about light absorption loss in the gate electrodes if the gate electrode is provided to cover the photoelectric conversion elements. The transfer transistor gate electrodes are not formed above the photoelectric conversion elements, thus preventing sensitivities of these pixels from being deteriorated. As a result, it can be provided the solid-state imaging device that suppresses crosstalk of light in the semiconductor substrate to the neighboring active element with respect to each pixel.

(Modification 3)

Modification 3 provides a solid-state imaging device having a structure where a transfer transistor gate electrode of an R pixel is further extended and provided to cover an inter-element region, i.e., a space between the unit cells, reaching close to a photoelectric conversion element of a neighboring unit cell.

Figure 15:
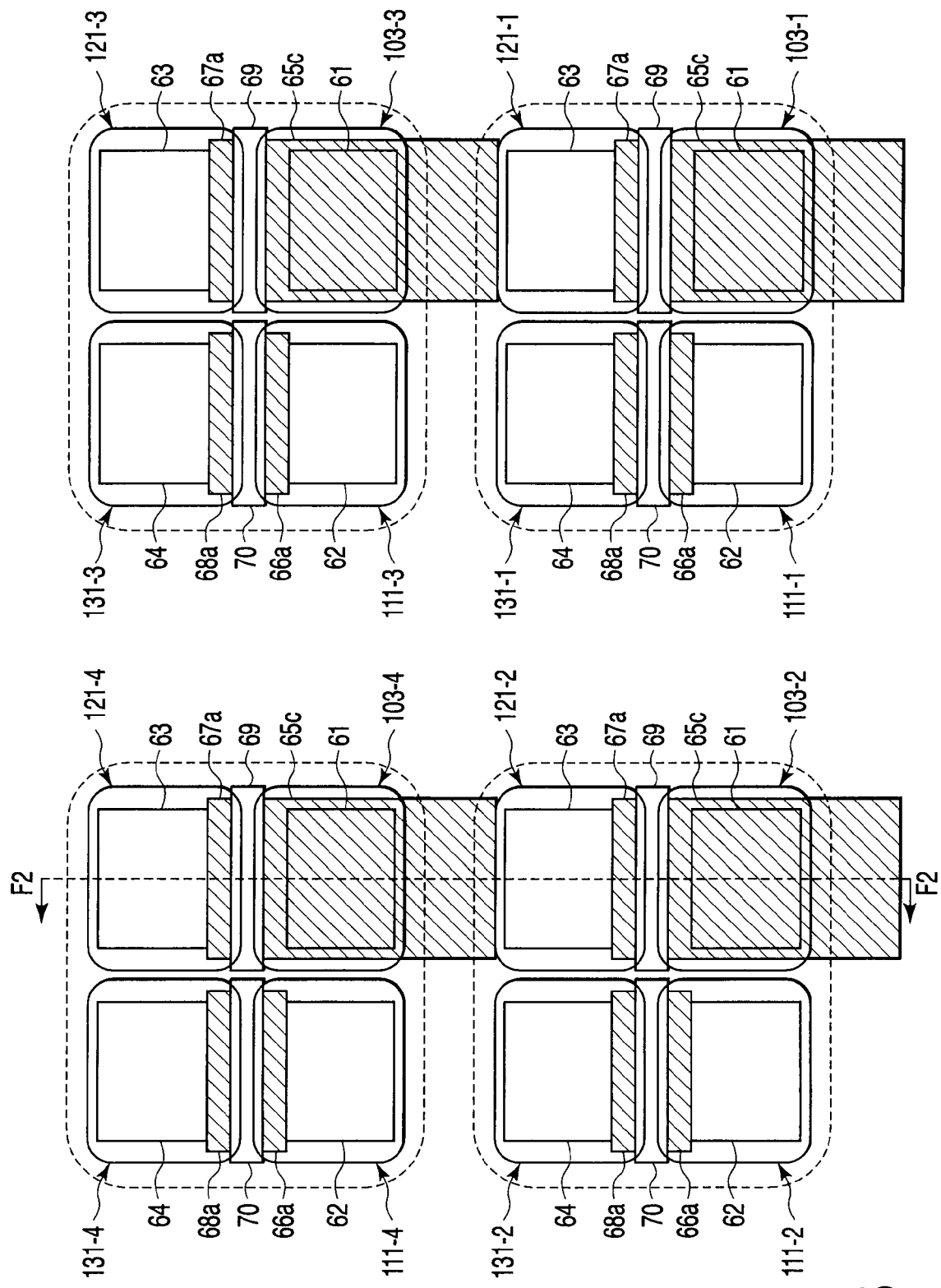
FIG. 15 is a plan view showing an example of a solid-state imaging device according to modification 3 of the present invention.
Figure 16:
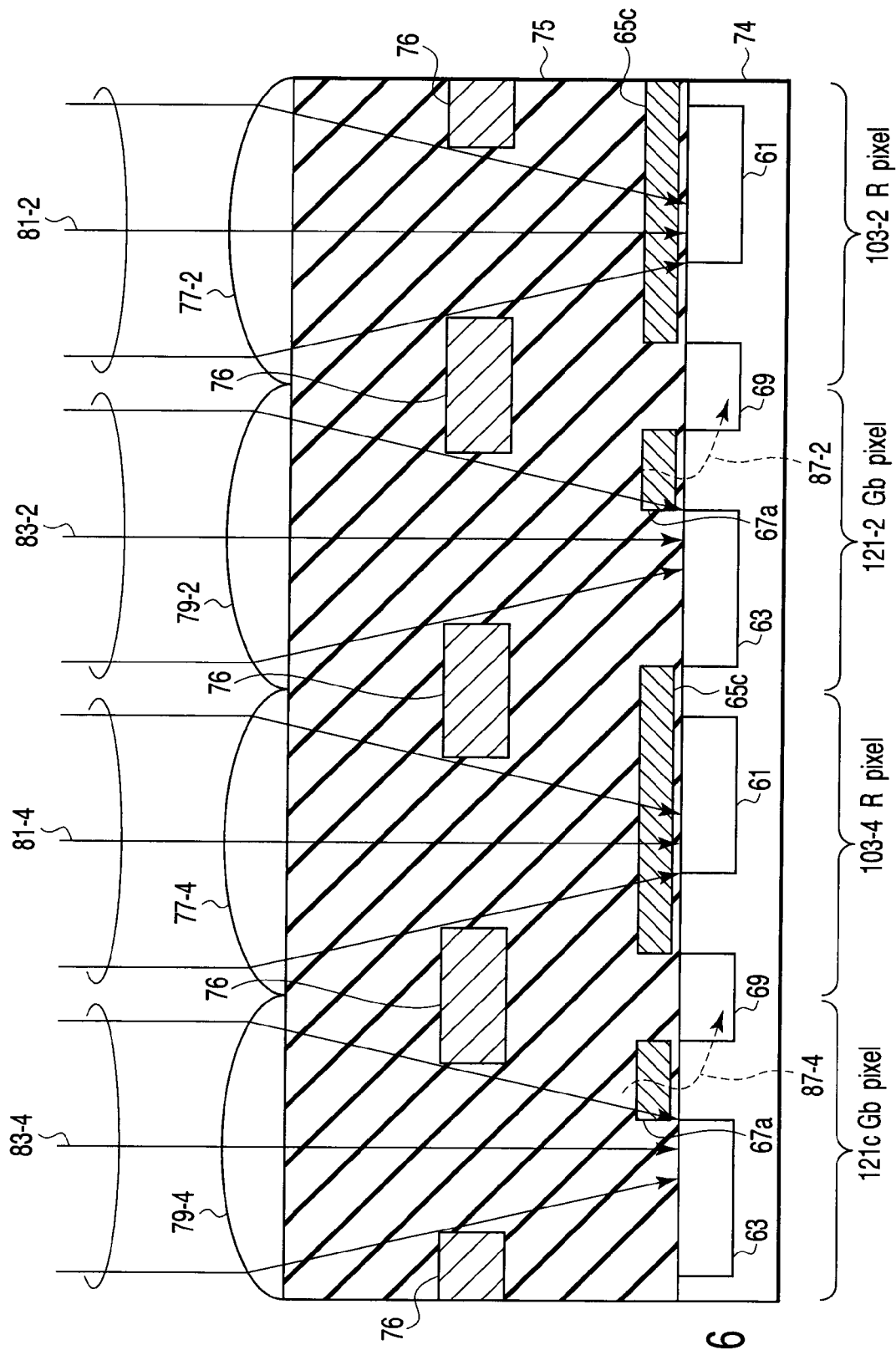
FIG. 16 shows an example of a cross-sectional view of the solid-state imaging device according to the modification 3.

A solid-state imaging device according to this modification will now be explained with reference to FIGS. 15 and 16. FIG. 15 is a plan view showing an example of a unit cell according to this modification, and FIG. 16 is a cross-sectional view taken along a cutting-plane line F2-F2 depicted in FIG. 15.

In this modification, as shown in the drawing, for example, a transfer transistor gate electrode 65c of an R pixel 103-4 is extended beyond a photoelectric conversion element 61-4 to be adjacent to a photoelectric conversion element 63 of a Gb pixel 121-2 of a neighboring unit cell that is provided in the opposite side of a Gb pixel 121-4 that shares a floating junction 69.

This modification has an effect in that diffraction of incident light 81 entering the R pixel 101 can be further reduced as compared with the third embodiment by enlarging a size of the transfer transistor gate electrode 65c of the R pixel 103 that covers the photoelectric conversion element 61. When the structure according to this modification is adopted, crosstalk can be more effectively suppressed from occurring even if an incident light irradiating region is expanded due to, e.g., oblique incident light.

Here, although each transfer transistor gate electrode has been explained by using the example where it is formed as in Modification 2, this modification can also be applied to other transfer transistor gate electrode structure, such as described in any one of the first and the second embodiments, Modifications 1 and 2, and any other structure designed to provide the functions equivalent to those in the present structure.

Fourth Embodiment

A fourth embodiment according to the present invention provides another solid-state imaging device adopting a two-pixel/one-cell mode enabling higher integration than the third embodiment. The solid-state imaging device according to this embodiment is characterized in that each oblique gate electrode obliquely provided with respect to a photoelectric conversion element is included. Additionally, at least one oblique gate electrode in one unit cell is extended to cover the photoelectric conversion element.

Figure 17:
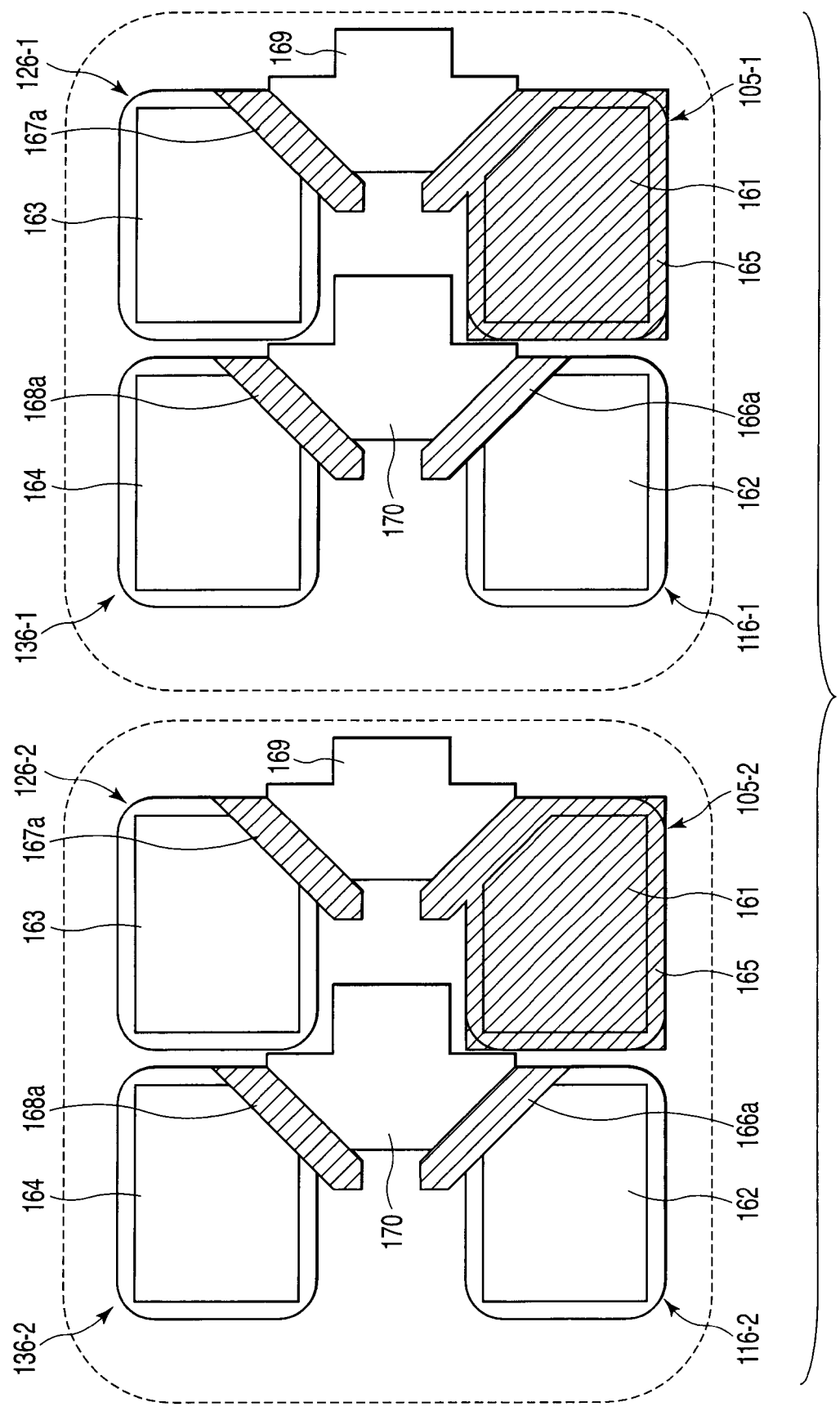
FIG. 17 is a plan view showing an example of a solid-state imaging device according to a fourth embodiment of the present invention.

FIG. 17 is a plan view showing an example of the solid-state imaging device according to the fourth embodiment. The drawing shows two unit cells each including four pixels 105, 116, 126, and 136 aligned in two rows and two columns. Each of photoelectric conversion elements 161 to 164 of the respective pixels has one corner that is cut out at substantially 45°. Transfer transistor gate electrodes 165 and 166a to 168a are obliquely provided at the corresponding cut parts.

Floating junctions 169 and 170 are arranged at a central region of the four pixels. One floating junction is shared by two pixels. In the example shown in FIG. 17, the floating junction 169 is shared by an R pixel 105 and a Gb pixel 126, and the floating junction 170 is shared by a Gr pixel 116 and a B pixel 136. A method of sharing the floating junction is not limited to two pixels arranged vertically as shown in FIG. 17. For example, the floating junction may be shared by two pixels that are adjacent to each other in a lateral direction, or by two pixels in a diagonal direction of the floating junction.

One side of the floating junction 169 or 170 facing the photoelectric conversion element 161, 162, 163, or 164 is formed in parallel with an oblique side of the photoelectric conversion element 161, 162, 163, or 164 in such a manner that a channel width below the oblique gate electrode 165, 166a, 167a, or 168a becomes uniform. As a result, the floating junction 169 or 170 has a complicated shape rather than a simple rectangular shape as shown in FIG. 17.

In general, when the transfer transistor has an oblique gate electrode, a pixel that tends to be affected by crosstalk due to incident light entering a given pixel is different from those in the first to the third embodiments. Since the crosstalk occurs when the incident light causes a diffraction phenomenon at an edge of the gate electrode, the crosstalk tends to occur in a pixel arranged in a direction perpendicular to the edge of the gate electrode on the photoelectric conversion element side. For example, when light enters the R pixel, the crosstalk tends to occur to the B pixel in the oblique direction, and the crosstalk to the Gr pixel or the Gb pixel that is adjacent in the horizontal or vertical direction is small. Likewise, when light enters the Gr pixel, the crosstalk tends to occur in the Gb pixel.

According to this embodiment, at least one of the transfer transistor gate electrodes 165 to 168 is extended to cover a corresponding photoelectric conversion element 161, 162, 163, or 164. In the example of FIG. 17, the gate electrode 165 of the R pixel 105 is provided to cover the photoelectric conversion element 161. Since light that enters the R pixel 105 has a wavelength longer than those of incident lights entering the other pixels 116 to 136, light absorption in a semiconductor substrate is small so that the crosstalk tends to occur. Thus, when the transfer transistor gate electrode 165 of the R pixel 105 is extended and provided above the photoelectric conversion element 161, the diffraction phenomenon of light can be prevented from occurring in the R pixel 105, thereby avoiding from image quality being lowered. Although the transfer transistor gate electrode is extended to cover above the R pixel alone in this embodiment, the present invention is not limited thereto, and other gate electrodes may be extended and formed above other corresponding pixels.

As a result, it can be provided the solid-state imaging device that suppresses crosstalk of light in the semiconductor substrate to the neighboring active element with respect to each pixel.

(Modification 4)

Modification 4 provides a solid-state imaging device with oblique gate electrodes having a structure where transfer transistor gate electrodes of all pixels are extended to cover corresponding photoelectric conversion elements. This modification also provides the solid-state imaging device adopting a two-pixel/one-cell mode as in the fourth embodiment, but this modification is different from the fourth embodiment in how to share one floating junction.

Figure 18:
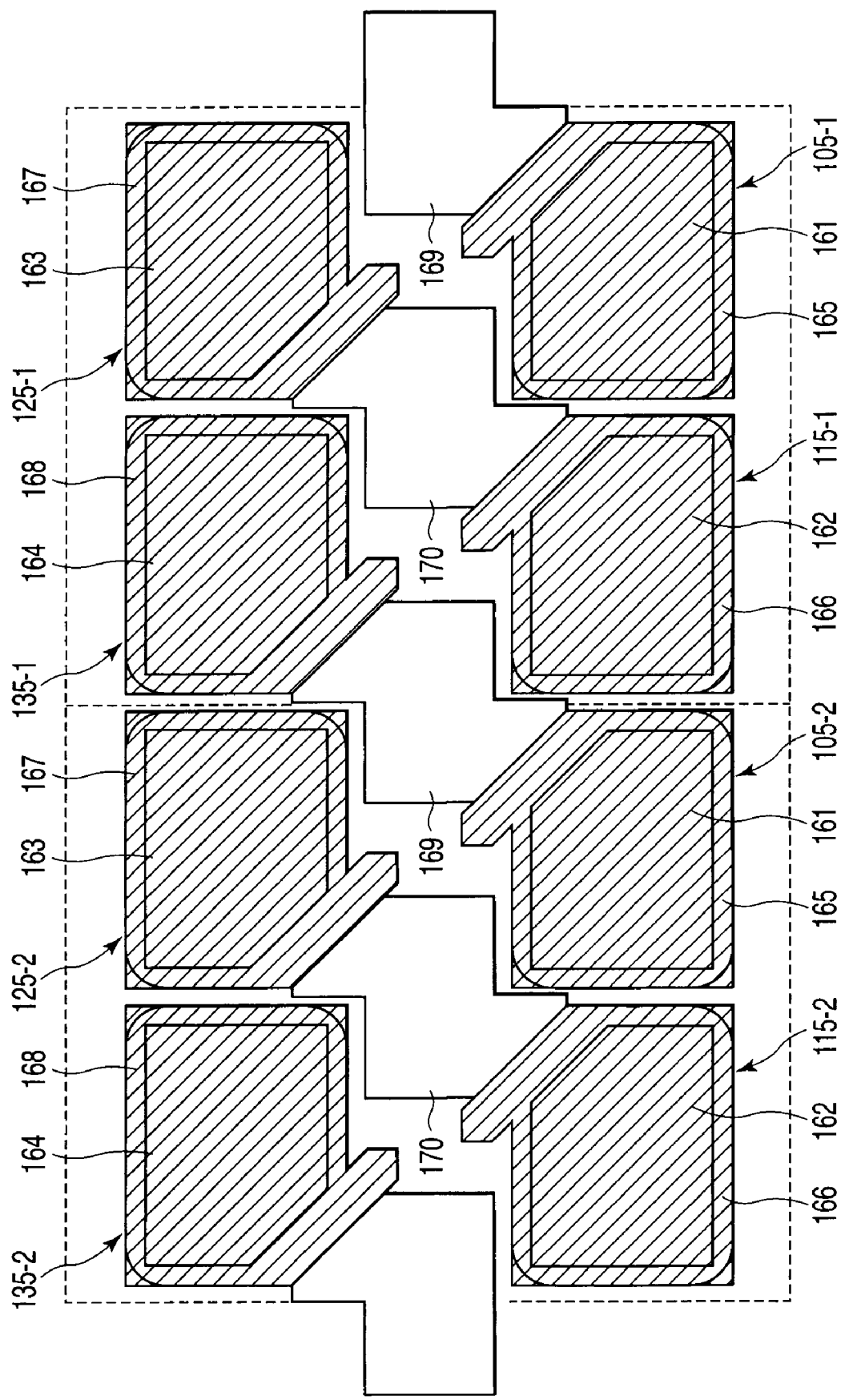
FIG. 18 is a plan view showing an example of a solid-state imaging device according to modification 4 of the present invention.

FIG. 18 is a plan view showing an example of the solid-state imaging device according to Modification 4. A unit cell includes four pixels 105, 115, 125, and 135. Floating junctions 169 and 170 are arranged in a central region of the four pixels 105, 115, 125, and 135, and each floating junction is shared by two pixels arranged in a diagonal direction of the floating junction. For example, the floating junction 170 is shared by the Gr pixel 115-2 and the Gb pixel 125-2, and the floating junction 169 is shared by the R pixel 105-2 and a B pixel 135-1 in a neighboring unit cell.

Transfer transistor gate electrodes 165 to 168 of the respective pixels are provided to cover corresponding photoelectric conversion elements 161 to 164. As a result, each incident light can be prevented from being diffracted at each edge of the gate electrode, thus the solid-state imaging device that suppresses the crosstalk can be provided. When a loss of light caused by covering the photoelectric conversion element with the gate electrode is a problem, as explained in conjunction with Modification 1, the film thickness of each gate electrode can be adjusted to compensate for the difference in absorption of incident light in each gate electrode so that the loss of light in each pixel can be reduced and equalized.

In this manner, it can be provided the solid-state imaging device that suppresses crosstalk of light in the semiconductor substrate to the neighboring active element with respect to each pixel Fifth Embodiment A fifth embodiment according to the present invention provides a solid-state imaging device adopting a four-pixel/one-cell mode having oblique gate electrodes. Further, at least one gate electrode in a unit cell is extended to cover a photoelectric conversion element.

Figure 19:
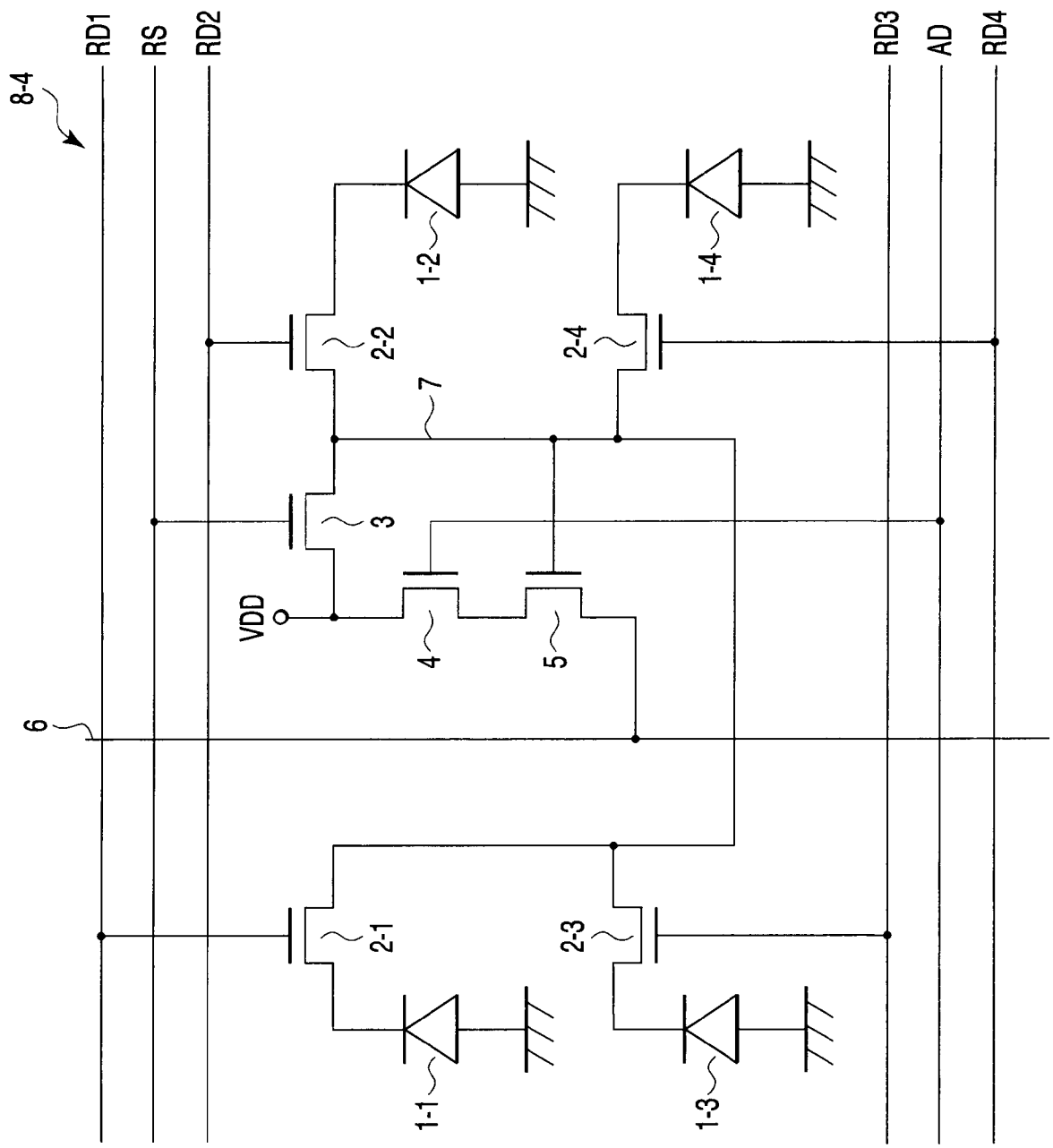
FIG. 19 shows an example of a pixel circuit configuration for explaining a solid-state imaging device according to a fifth embodiment of the present invention.

FIG. 19 shows an example of a pixel circuit configuration for explaining an operation of a solid-state imaging device adopting a four-pixel/one-cell mode. The solid-state imaging device adopting the four-pixel/one-cell mode is different from the counterpart adopting the two-pixel/one-cell mode depicted in FIG. 11 in that a pixel region 8-4 includes four photoelectric conversion elements 1-1 to 1-4 and four transfer transistors 2-1 to 2-4 and these members share one floating junction 7. As a result, the pixel circuit can reduce its component to include one of each floating junction 7, reset transistor 3, address transistor 4, and amplification transistor 5 to four pixels. Consequently, the proportion of an area of the photoelectric conversion elements in an occupied area of the unit cell can be increased, and hence higher integration can be realized. Although an operation is basically the same as those in the one-pixel/one-cell mode and the two-pixel/one-cell mode, charge signals respectively stored in the photoelectric conversion elements 1-1 to 1-4 are sequentially read.

Figure 20:
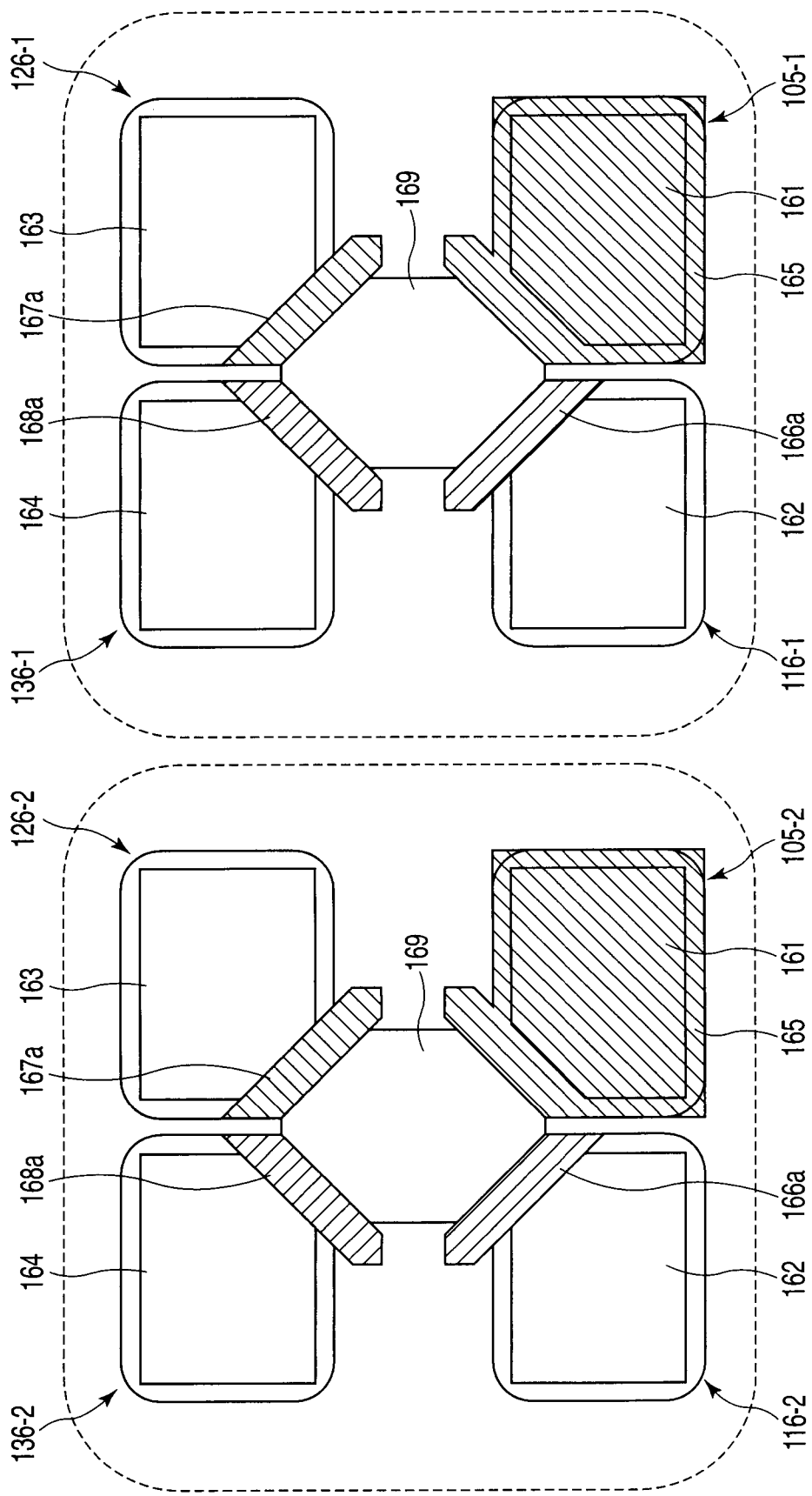
FIG. 20 is a plan view showing an example of the solid-state imaging device according to the fifth embodiment.

FIG. 20 is a plan view showing an example of the solid-state imaging device according to the fifth embodiment. The drawing shows two unit cells each including four pixels 105, 116, 126, and 136 aligned in two rows and two columns. One floating junction 169 is provided in a central region of each unit cell. One corner of each of photoelectric conversion elements 161 to 164 of the respective pixels close to the floating junction 169 is cut out at substantially 45°. Transfer transistor gate electrodes 165 and 166a to 168a are obliquely provided at the cut parts.

In this example, the transfer transistor gate electrode 165 of the R pixel 105 is extended to cover the photoelectric conversion element 162. The transfer transistor gate electrodes 166a to 168a of the other pixels 116 to 136 are provided to be adjacent to the photoelectric conversion elements 162 to 164. The gate electrodes can be extended not only above the R pixel but also extended above some or all of the other pixels as explained above. Furthermore, when each gate electrode is adjusted to have an appropriate film thickness depending on a wavelength of incident light entering each pixel, an incident light intensity entering to each photoelectric conversion element can be set substantially equivalent without being dependent on a wavelength of each incident light.

As explained above, according to the various embodiments of the present invention, when the transfer transistor gate electrode of at least one pixel, e.g., the R pixel in the unit cell is extended to cover the photoelectric conversion element, it can be provided the solid-state imaging device that suppresses crosstalk of light in the semiconductor substrate to the neighboring active element with respect to each pixel.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state imaging device comprising:
a plurality of pixels, each pixel comprising:
a photoelectric conversion element that is provided in a semiconductor substrate and performs photoelectric conversion of incident light to store signal charges;
a floating junction that is provided in the semiconductor substrate in the proximity of the photoelectric conversion element and temporarily stores signal charges; and
a transfer transistor that transfers the signal charges stored in the photoelectric conversion element to the floating junction,
wherein at least one transfer transistor of the pixels includes a gate electrode extended to cover a corresponding photoelectric conversion element completely, and at least one transfer transistor of the pixels includes a gate electrode that does not cover the photoelectric conversion element; and
wherein the remaining transfer transistors of the plurality of pixels include a gate electrode to cover the photoelectric conversion element completely.

2. The solid-state imaging device according to claim 1, further comprising:
a unit cell including a plurality of pixels arranged to be adjacent to each other,
wherein the photoelectric conversion elements of the respective pixels in the unit cell receive incident lights selectively limited to different wavelength regions.

3. The solid-state imaging device according to claim 2, wherein a film thickness of the gate electrode provided to cover the photoelectric conversion element differs in accordance with the selectively limited wavelength of the incident light that enters the photoelectric conversion element.

4. The solid-state imaging device according to claim 2, wherein the gate electrode provided to cover the photoelectric conversion element is selectively provided in accordance with the selectively limited wavelength of the incident light that enters the photoelectric conversion element.

5. The solid-state imaging device according to claim 2, wherein the gate electrode provided to cover the photoelectric conversion element is extended on an inter-element region between the photoelectric conversion element and a neighboring photoelectric conversion element on the opposite side of the floating junction.

6. The solid-state imaging element according to claim 1, wherein the gate electrode is made of an electroconductive material that transmits visible light.

7. A solid-state imaging device comprising:
a plurality of pixels, each pixel comprising:
   a photoelectric conversion element that is provided in a semiconductor substrate and performs photoelectric conversion of incident light to store signal charges;
   a floating junction that is provided in the semiconductor substrate in the proximity of the photoelectric conversion element and temporarily stores signal charges; and
   a transfer transistor that transfers the signal charges stored in the photoelectric conversion element to the floating junction,
   wherein the floating junction is electrically connected with a plurality of photoelectric conversion elements through corresponding transfer transistors in such a manner that the floating junction is shared by the plurality of photoelectric conversion elements, and
   wherein at least one transfer transistor of the pixels includes a gate electrode extended to cover a corresponding photoelectric conversion element completely, and at least one transfer transistor of the pixels includes a gate electrode that does not cover the photoelectric conversion element; and
   wherein the remaining transfer transistors of the plurality of pixels include a gate electrode to cover the photoelectric conversion element completely.

8. The solid-state imaging device according to claim 7, further comprising:
a unit cell including a plurality of pixels arranged to be adjacent to each other,
wherein the photoelectric conversion elements of the respective pixels in the unit cell receive incident lights selectively limited to different wavelength regions.

9. The solid-state imaging device according to claim 8, wherein a film thickness of the gate electrode provided to cover the photoelectric conversion element differs in accordance with the selectively limited wavelength of the incident light that enters the photoelectric conversion element.

10. The solid-state imaging device according to claim 8, wherein the gate electrode provided to cover the photoelectric conversion element is selectively provided in accordance with the selectively limited wavelength of the incident light that enters the photoelectric conversion element.

11. The solid-state imaging device according to claim 8, wherein the gate electrode provided to cover the photoelectric conversion element is extended on an inter-element region between the photoelectric conversion element and a neighboring photoelectric conversion element on the opposite side of the floating junction.

12. The solid-state imaging element according to claim 7, wherein the gate electrode is made of an electroconductive material that transmits visible light.

13. The solid-state imaging device according to claim 7, wherein one corner of the photoelectric conversion element is obliquely cut out,
wherein the transfer transistor includes a gate electrode obliquely provided at the obliquely cut corner of the photoelectric conversion element, and
wherein the floating junction is arranged in a central region of four pixels.

14. The solid-state imaging device according to claim 13, wherein the floating junction is shared by two pixels adjacent to the floating junction.

15. The solid-state imaging device according to claim 14, wherein the two pixels are arranged to be adjacent to the floating junction in a diagonal direction of the floating junction.

16. The solid-state imaging device according to claim 7, wherein the floating junction is shared by the four pixels arranged to be adjacent to the floating junction.

* * * * *